US012787816B2

(12) United States Patent
Saito

(10) Patent No.: US 12,787,816 B2
(45) Date of Patent: Nov. 3, 2026

(54) ELECTRONIC DEVICE AND METHOD FOR MANUFACTURING THE SAME

(71) Applicants: Kabushiki Kaisha Toshiba, Tokyo (JP); Toshiba Electronic Devices & Storage Corporation, Tokyo (JP)

(72) Inventor: Tomohiro Saito, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 462 days.

(21) Appl. No.: 18/455,589

(22) Filed: Aug. 24, 2023

(65) Prior Publication Data

US 2024/0321544 A1 Sep. 26, 2024

(30) Foreign Application Priority Data

Mar. 22, 2023 (JP) ................................ 2023-045871

(51) Int. Cl.
*H10W 70/63* (2026.01)
*H01J 37/12* (2006.01)
*H01J 9/00* (2006.01)

(52) U.S. Cl.
CPC ........... *H10W 70/635* (2026.01); *H01J 37/12* (2013.01); *H01J 9/00* (2013.01); *H05K 2201/098* (2013.01); *Y10T 29/49117* (2015.01)

(58) Field of Classification Search
CPC ...................... H10W 70/635; H05K 2201/098
See application file for complete search history.

(56) References Cited

U.S. PATENT DOCUMENTS 6,953,938 B2 * 10/2005 Iwasaki ............... H01J 37/1477 250/492.2

FOREIGN PATENT DOCUMENTS

JP 2005-136114 A 5/2005
JP 2007-019242 A 1/2007
JP 2021-068505 A 4/2021

OTHER PUBLICATIONS

Notice of Reasons for Refusal mailed on Mar. 3, 2026, in the counterpart Japanese patent application No. 2023-045871, 12 pages (with Translation).

* cited by examiner

*Primary Examiner* — Adam Krupicka
(74) *Attorney, Agent, or Firm* — Kim & Stewart LLP

(57) ABSTRACT

According to one embodiment, an electronic device includes a substrate, an electrode, and a facing portion. The substrate has a through hole. The electrode is provided in the through hole in the substrate and extends along an axial direction of the through hole. The facing portion is provided on the substrate, is disposed at a position closer to a center of the through hole in a width direction than is the electrode, and faces, in the width direction, a portion of the electrode on one end side in the axial direction.

14 Claims, 14 Drawing Sheets

ELECTRONIC DEVICE AND METHOD FOR MANUFACTURING THE SAME

CROSS-REFERENCE TO RELATED APPLICATIONS

This application is based upon and claims the benefit of priority from Japanese Patent Application No. 2023-045871, filed on Mar. 22, 2023; the entire contents of which are incorporated herein by reference.

FIELD

Embodiments described herein relate to an electronic device and a method for manufacturing the same.

BACKGROUND

There is an electronic device including a substrate that has a through hole, and an electrode provided in the through hole. In such an electronic device, high reliability is desired.

DETAILED DESCRIPTION

Figure 1:
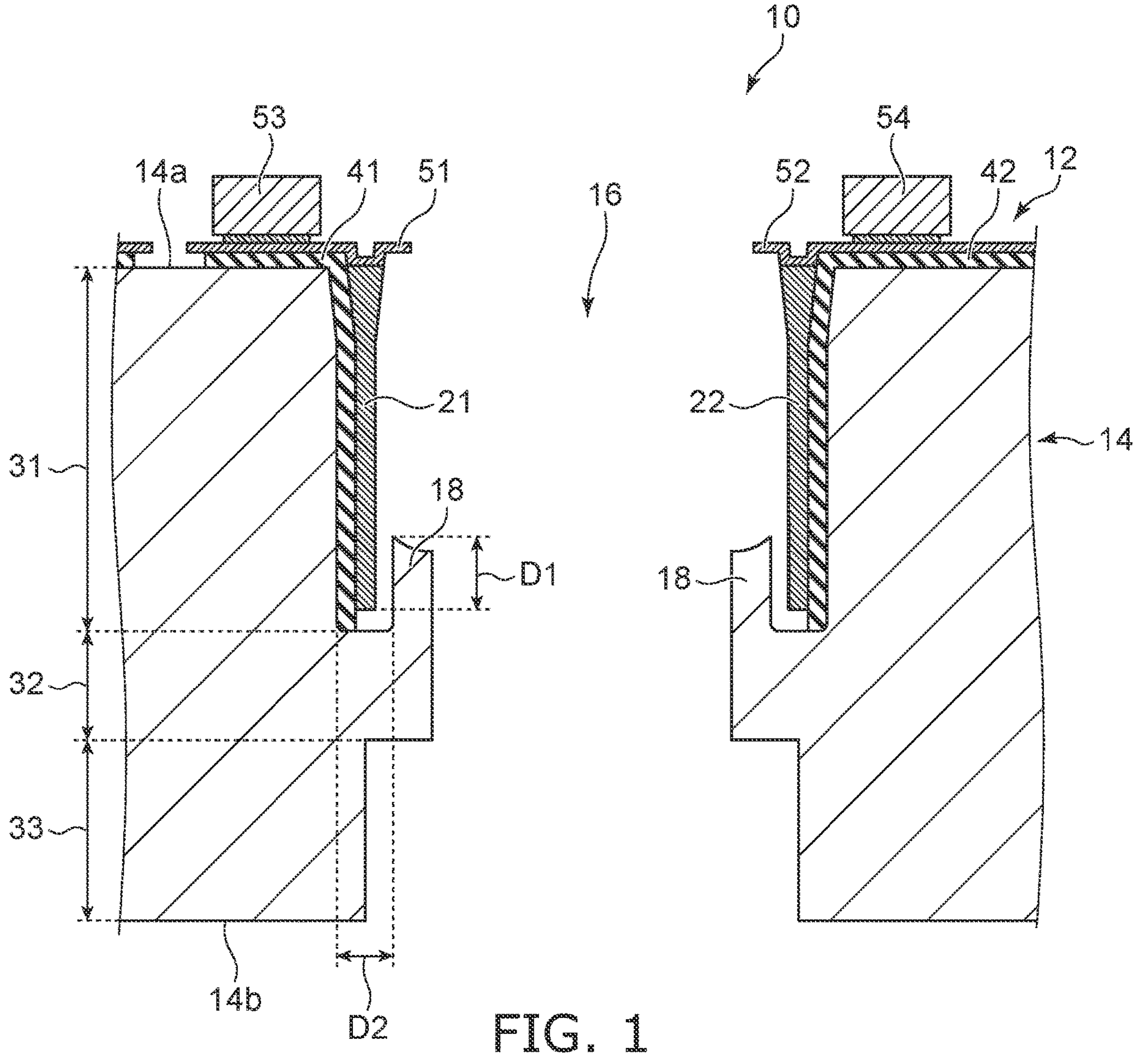
FIG. 1 is a cross-sectional view schematically showing an electronic device according to a first embodiment.

According to one embodiment, an electronic device includes a substrate, an electrode, and a facing portion. The substrate has a through hole. The electrode is provided in the through hole in the substrate and extends along an axial direction of the through hole. The facing portion is provided on the substrate, is disposed at a position closer to a center of the through hole in a width direction than is the electrode, and faces, in the width direction, a portion of the electrode on one end side in the axial direction.

According to another embodiment, a method is disclosed for manufacturing an electronic device. The method can include forming a first groove on a first surface side of a substrate including a first surface and a second surface opposite to the first surface. The method can include forming a conductive portion inside the first groove. The method can include forming a second groove on the first surface side of the substrate side by side with the conductive portion, exposing at least a portion of the conductive portion to a second groove side, and forming, on the second groove side of the conductive portion, a facing portion facing the portion of the conductive portion on the second surface side in a direction in which the conductive portion and the second groove are arranged side by side. The method can include adhering a support substrate, via an adhesive, to the first surface side of the substrate. The method can include forming a through hole penetrating the substrate by forming a third groove reaching the second groove on the second surface side of the substrate, and forming, from the conductive portion, an electrode provided in the through hole in the substrate and extending along an axial direction of the through hole. The method can include removing the support substrate and the adhesive.

Various embodiments will be described hereinafter with reference to the accompanying drawings.

The drawings are schematic or conceptual; and the relationships between the thicknesses and the widths of portions, the proportions of sizes between portions, etc., are not necessarily the same as the actual values thereof. Also, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

FIG. 1 is a cross-sectional view schematically showing an electronic device according to a first embodiment.

Figure 2:
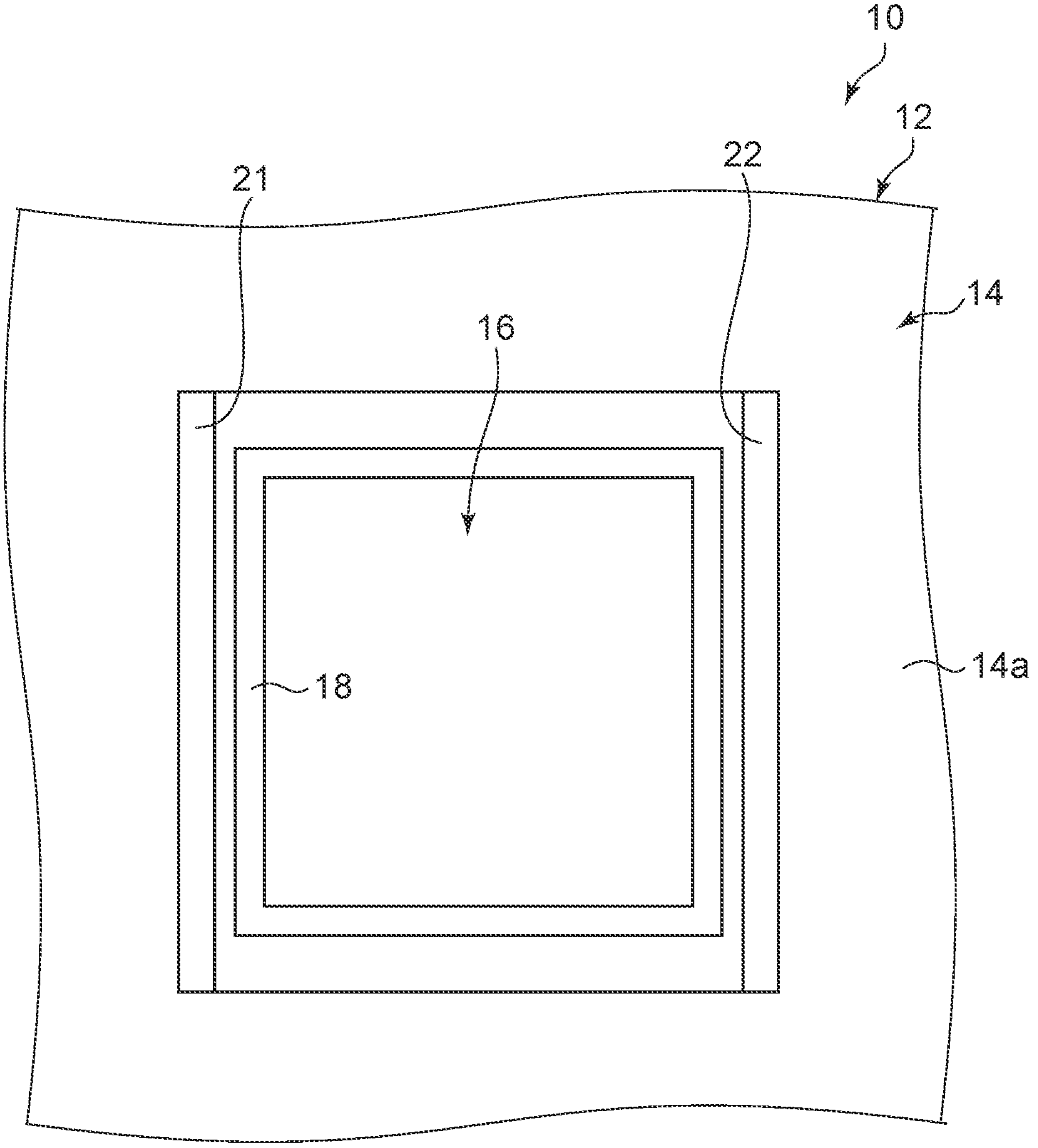
FIG. 2 is a plan view schematically showing a portion of the electronic device according to the first embodiment.

FIG. 2 is a plan view schematically showing a portion of the electronic device according to the first embodiment.

As shown in FIGS. 1 and 2, an electronic device 10 includes a substrate 12 and electrodes 21 and 22. FIG. 2 is a plan view schematically showing a portion of the electronic device 10 when viewed from an upper side in FIG. 1.

The substrate 12 includes a substrate main body 14 and a through hole 16 provided in the substrate main body 14. The substrate main body 14 includes a first surface 14*a* and a second surface 14*b*. The first surface 14*a* is a surface on one end side of the through hole 16 in an axial direction. The second surface 14*b* is a surface on the other end side of the through hole 16 in the axial direction. In other words, the second surface 14*b* is a surface opposite to the first surface 14*a*. The through hole 16 penetrates the substrate main body 14 to allow a first surface 14*a* side and a second surface 14*b* side of the substrate main body 14 to communicate with each other.

The electrodes 21 and 22 are provided in the through hole 16 in the substrate main body 14 (substrate 12) and extend along the axial direction of the through hole 16. In other words, the axial direction of the through hole 16 is a direction in which the through hole 16 penetrates the substrate main body 14. In FIG. 1, the axial direction of the through hole 16 is an up-down direction on paper.

The second surface 14*b* is, for example, substantially parallel to the first surface 14*a*. The through hole 16 extends, for example, in a direction orthogonal to the first surface 14*a* and the second surface 14*b*. In other words, the axial direction of the through hole 16 is a direction orthogonal to the first surface 14*a* and the second surface 14*b*. In other words, the electrodes 21 and 22 extend in a direction orthogonal to the first surface 14*a* and the second surface 14*b*.

However, the direction in which the through hole 16 extends is not limited to a direction strictly perpendicular to the first surface 14*a* and the second surface 14*b*, and may at least have a component extending perpendicularly to the first surface 14*a* and the second surface 14*b*. For example, the through hole 16 may extend in the direction orthogonal to the first surface 14*a* and the second surface 14*b* (up-down direction on paper in FIG. 1) while being inclined with respect to the first surface 14*a* and the second surface 14*b*. The same applies to the direction in which the electrodes 21 and 22 extend. The directions in which the through hole 16 and the electrodes 21 and 22 extend may be different.

For example, the electrodes 21 and 22 are disposed close to the first surface 14*a* side. For example, the electrodes 21 and 22 extend from the first surface 14*a* side toward the second surface 14*b* side. Ends of the electrodes 21 and 22 on the first surface 14*a* side are disposed, for example, close to the first surface 14*a*. A distance between the ends of the electrodes 21 and 22 on the first surface 14*a* side and the first surface 14*a* is, for example, shorter than a distance between ends of the electrodes 21 and 22 on the second surface 14*b* side and the second surface 14*b*.

The electronic device 10 includes multiple electrodes 21 and 22 provided in the through hole 16. The electronic device 10 includes, for example, a pair of electrodes 21 and 22. For example, the pair of electrodes 21 and 22 face each other with the through hole 16 interposed therebetween. In other words, the pair of electrodes 21 and 22 are disposed, for example, on both sides of the through hole 16 in a width direction. The width direction of the through hole 16 is a direction orthogonal to the axial direction of the through hole 16. In FIG. 1, the width direction of the through hole 16 is a left-right direction on paper.

The pair of electrodes 21 and 22 are, for example, plate-shaped electrodes extending along the axial direction of the through hole 16 and extending in a circumferential direction of the through hole 16. The circumferential direction of the through hole 16 is, in other words, a direction around an axis along the axial direction. The circumferential direction of the through hole 16 is, for example, a direction orthogonal to paper in FIG. 1.

The electronic device 10 is used to, for example, control an electron beam passing inside the through hole 16. The electronic device 10 controls a traveling direction of the electron beam passing inside the through hole 16 by, for example, controlling a magnitude of a voltage applied between the pair of electrodes 21 and 22. The electronic device 10 is applied to a device that controls an electron beam and emits the electron beam to an object to perform observation, processing, and the like, such as an electron microscope that performs surface observation with the electron beam, an electron beam lithography system that draws a fine pattern on a mask or a wafer, or an inspection device that scans a surface with the electron beam to detect a defect. The electronic device 10 is, for example, an electron beam control device such as an electrostatic lens or a deflector.

However, use of the electronic device 10 is not limited to those described above. The electronic device 10 is applicable to any device that requires the electrode provided in the through hole 16 of the substrate 12. In addition, the number of electrodes provided in the through hole 16 is not limited to two, and may be three or more. The number of electrodes provided in the through hole 16 may also be one. The number of electrodes provided in the through hole 16 may be appropriately set according to the use of the electronic device 10.

The electronic device 10 further includes a facing portion 18. The facing portion 18 is provided on the substrate main body 14 (substrate 12), is disposed at a position closer to a width direction center of the through hole 16 than are the electrodes 21 and 22, and faces, in the width direction, portions of the electrodes 21 and 22 on one end side in the axial direction. In other words, the substrate 12 includes the facing portion 18 provided on the substrate main body 14.

In other words, the facing portion 18 faces portions of the electrodes 21 and 22 on the second surface 14*b* side. An end of the facing portion 18 on the first surface 14*a* side is located, for example, between both ends of the electrodes 21 and 22 in the axial direction. The facing portion 18 does not face, in the width direction, portions of the electrodes 21 and 22 on the first surface 14*a* side. The portions of the electrodes 21 and 22 on the first surface 14*a* side face, in the width direction of the through hole 16, a space inside the through hole 16.

The electrodes 21 and 22 include faces facing a center side of the through hole 16. Portions, on the second surface 14*b* side, of the faces of the electrodes 21 and 22 facing the center side of the through hole 16 face the facing portion 18 in the width direction. Remaining portions of the surfaces of the electrodes 21 and 22 facing the center side of the through hole 16 face the space inside the through hole 16 in the width direction without being covered with another member.

The substrate main body 14 (substrate 12) includes a first portion 31 and a second portion 32. The first portion 31 sets the through hole 16 to a predetermined width between the first surface 14*a* and the second surface 14*b*. In the second portion 32, a width of the through hole 16 between the first portion 31 and the second surface 14*b* is smaller than the width of the through hole 16 in the first portion 31.

In the example, the substrate main body 14 further includes a third portion 33 that is located between the second portion 32 and the second surface 14*b* and where a width of the through hole 16 is larger than the width of the through hole 16 in the second portion 32.

For example, the electrodes 21 and 22 are provided inside the through hole 16 in the first portion 31. For example, the facing portion 18 is provided in the second portion 32 in a manner of extending from the position closer to the width direction center of the through hole 16 than are the electrodes 21 and 22 toward the one end side (first surface 14*a* side) of the through hole 16. Accordingly, as described above, the facing portion 18 can face the portions of the electrodes 21 and 22 on the one end side in the axial direction.

As shown in FIG. 2, the facing portion 18 extends along the circumferential direction of the through hole 16 and faces the portion of each of the pair of electrodes 21 and 22 on the one end side in the axial direction.

As shown in FIG. 2, a shape of the through hole 16 as viewed in the axial direction (a shape as viewed from the first surface 14*a* side) is, for example, a quadrangular shape. The through hole 16 is, for example, a through hole having a substantially quadrangular cross-section. A shape of the facing portion 18 as viewed in the axial direction is, for example, a substantially quadrangular frame shape extending along the circumferential direction of the through hole 16. A shape of each of the electrodes 21 and 22 when viewed in the axial direction is, for example, a plate shape extending along two opposite sides of the quadrangular through hole 16.

Thus, in the example, the one facing portion 18 faces the portion of each of the pair of electrodes 21 and 22 on the one end side in the axial direction. The invention is not limited thereto, and a pair of facing portions 18 each corresponding to a respective one of the pair of electrodes 21 and 22 may be provided on the substrate main body 14. In other words, the substrate 12 may include multiple facing portions 18 each corresponding to a respective one of the multiple electrodes 21 and 22.

The shape of the through hole 16 as viewed in the axial direction is not limited to the quadrangular shape, and may be, for example, another polygonal shape, a circular shape, or an elliptical shape. The shape of the through hole 16 as viewed in the axial direction is not limited to that described above, and may be any shape. The shape of the facing portion 18 as viewed in the axial direction and the shapes of the electrodes 21 and 22 as viewed in the axial direction are not limited to those described above, and may be any shape corresponding to the shape of the through hole 16.

The substrate 12 includes insulating layers 41 and 42 provided between the first portion 31 of the substrate main body 14 and the electrodes 21 and 22. For example, the insulating layers 41 and 42 are in contact with the first portion 31 of the substrate main body 14. The electrodes 21 and 22 are in contact with the insulating layers 41 and 42. Accordingly, the electrodes 21 and 22 are provided in the first portion 31 via the insulating layers 41 and 42 in a state of being electrically insulated from the substrate main body 14 by the insulating layers 41 and 42. The insulating layer 41 between the first portion 31 and the electrode 21 and the insulating layer 42 between the first portion 31 and the electrode 22 may be implemented by one continuous insulating layer.

A material of the facing portion 18 is, for example, the same as a material of the substrate main body 14 (substrate 12). The substrate main body 14 contains, for example, silicon. In this case, the facing portion 18 also contains silicon similarly to the substrate main body 14. The substrate main body 14 is, for example, a silicon substrate. In other words, the substrate main body 14 is a semiconductor substrate.

For example, the facing portion 18 is provided integrally with the substrate main body 14. In other words, the facing portion 18 is a portion of the substrate main body 14. Accordingly, the material of the facing portion 18 is the same as the material of the substrate main body 14. The material of the substrate main body 14 is not limited to silicon and may be any material. The substrate main body 14 is not limited to the semiconductor substrate. The material of the substrate main body 14 may be appropriately selected according to the use of the electronic device 10 and the like.

The facing portion 18 is, for example, electrically connected to the substrate main body 14. The facing portion 18 is electrically connected to the substrate main body 14 by being provided integrally with the substrate main body 14 as described above. Accordingly, for example, a potential of the facing portion 18 can be substantially the same as a potential of the substrate main body 14.

The facing portion 18 is disposed at a predetermined interval from the electrodes 21 and 22 in the width direction of the through hole 16. Accordingly, it is possible to prevent the electrodes 21 and 22 from being conducted with the substrate main body 14 via the facing portion 18. In other words, the facing portion 18 can be electrically insulated from the electrodes 21 and 22. Accordingly, for example, when controlling an electron beam passing through the through hole 16 by applying a voltage between the electrodes 21 and 22, a voltage of an appropriate magnitude can be applied between the electrodes 21 and 22.

As shown in FIG. 1, an axial direction length D1 of a portion of the facing portion 18 facing portions of the electrodes 21 and 22 is, for example, longer than a distance D2 between the facing portion 18 and the substrate main body 14 in the width direction. In addition, the length D1 of the facing portion 18 is set to be, for example, no more than half an axial direction length of each of the electrodes 21 and 22.

The electronic device 10 further includes, for example, wiring layers 51 and 52 and connection electrodes 53 and 54. The wiring layers 51 and 52 are provided, for example, on the first surface 14*a* of the substrate main body 14. The wiring layer 51 is, for example, electrically connected to the electrode 21 by being in contact with the end of the electrode 21 on the first surface 14*a* side. The wiring layer 52 is, for example, electrically connected to the electrode 22 by being in contact with the end of the electrode 22 on the first surface 14*a* side. The connection electrode 53 is provided on the wiring layer 51 and electrically connected to the wiring layer 51. The connection electrode 54 is provided on the wiring layer 52 and electrically connected to the wiring layer 52.

The wiring layers 51 and 52 and the connection electrodes 53 and 54 are used for, for example, electrical connection between the electronic device 10 and another device. In other words, the connection electrodes 53 and 54 are electrode pads. For example, the voltage between the electrodes 21 and 22 is set via the wiring layers 51 and 52 and the connection electrodes 53 and 54. The voltage between the electrodes 21 and 22 is set by, for example, another device connected via the connection electrodes 53 and 54. In FIG. 2, the wiring layers 51 and 52 and the connection electrodes 53 and 54 are not illustrated for ease of illustration.

However, the method for setting the voltage between the electrodes 21 and 22 is not limited to that described above. For example, a circuit for setting the voltage between the electrodes 21 and 22 may be provided on the substrate main body 14. For example, when the substrate main body 14 is a semiconductor substrate, a CMOS circuit or the like may be provided on the substrate main body 14 in advance. The wiring layer may be provided, for example, inside the substrate main body 14. The wiring layers 51 and 52 and the connection electrodes 53 and 54 are provided as necessary and can be omitted.

Figure 3:
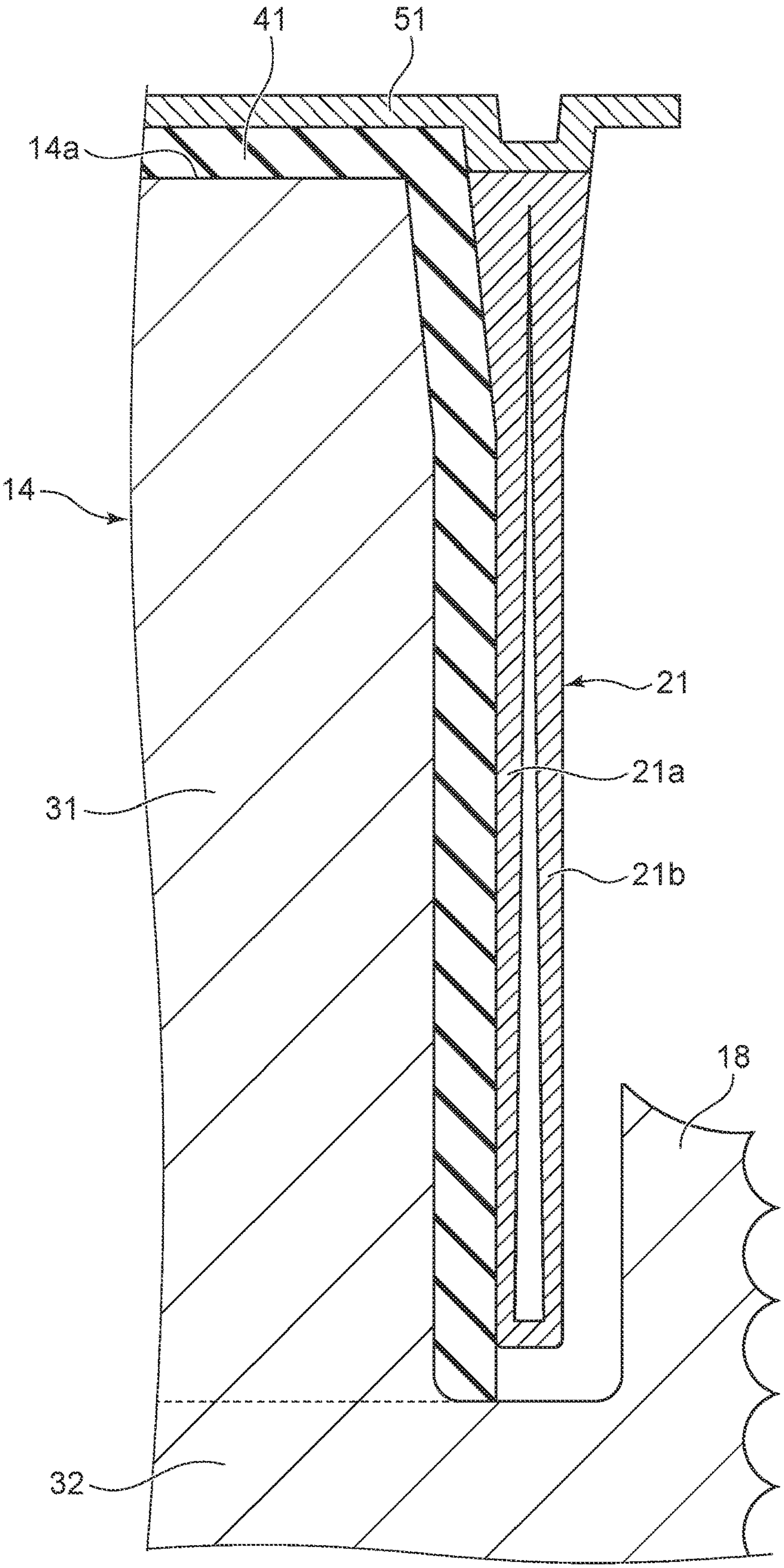
FIG. 3 is a cross-sectional view schematically showing a portion of the electronic device according to the first embodiment.

FIG. 3 is a cross-sectional view schematically showing a portion of the electronic device according to the first embodiment.

FIG. 3 shows a portion of the electrode 21 of the electronic device 10 in an enlarged manner.

As shown in FIG. 3, the electrode 21 is, for example, hollow. Although not illustrated, the electrode 22 is, for example, hollow similarly to the electrode 21.

The electrode 21 includes, for example, a first conductive portion 21*a* and a second conductive portion 21*b*. The first conductive portion 21*a* is, for example, provided on a substrate main body 14 side. The second conductive portion 21*b* is, for example, provided at a position closer to the width direction center of the through hole 16 than is the first conductive portion 21*a*. In other words, the first conductive portion 21*a* is provided between the substrate main body 14 (first portion 31) and the second conductive portion 21*b* in the width direction.

The first conductive portion 21*a* and the second conductive portion 21*b* extend along the axial direction of the through hole 16. In addition, the first conductive portion 21*a* and the second conductive portion 21*b* extend in the circumferential direction of the through hole 16. The first conductive portion 21*a* and the second conductive portion 21*b* are, for example, plate-shaped.

One end of the second conductive portion 21*b* in the axial direction is connected to one end of the first conductive portion 21*a* in the axial direction. The other end of the second conductive portion 21*b* in the axial direction is connected to the other end of the first conductive portion 21*a* in the axial direction. The second conductive portion 21*b* is separated from the first conductive portion 21*a* at an intermediate portion in the axial direction. In other words, a gap is provided between the first conductive portion 21*a* and the second conductive portion 21*b* in the intermediate portion of the electrode 21 in the axial direction.

Thus, the shape of the hollow electrode 21 is, more specifically, a shape in which a gap is provided between the first conductive portion 21*a* and the second conductive portion 21*b* in the intermediate portion in the axial direction. Ends of the first conductive portion 21*a* and the second conductive portion 21*b* in the circumferential direction may or may not be in contact with each other. The gap between the first conductive portion 21*a* and the second conductive portion 21*b* may, for example, communicate with the outside at the ends of the first conductive portion 21*a* and the second conductive portion 21*b* in the circumferential direction. The hollow electrode 21 is not limited to a shape including an internally closed space, and may be a shape including an internal space communicating with the outside. In addition, the electrode 21 is not necessarily hollow. The electrode 21 may have a shape including substantially no space therein.

FIGS. 4A to 4F and 5A to 5F are cross-sectional views schematically showing an example of a manufacturing process for the electronic device according to the first embodiment.

Figure 4A:
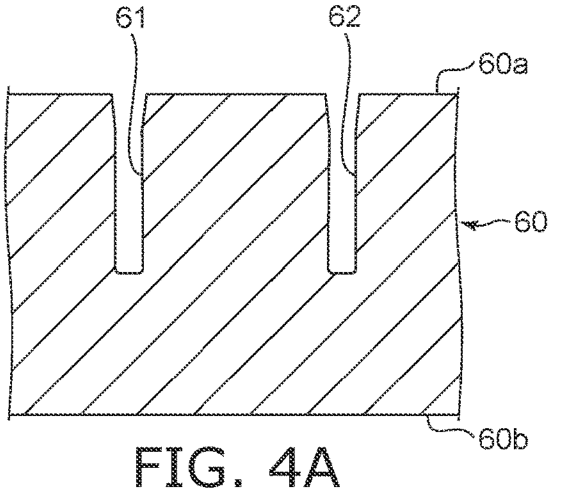
FIGS. 4A to 4F are cross-sectional views schematically showing an example of a manufacturing process for the electronic device according to the first embodiment.

As shown in FIG. 4A, when manufacturing the electronic device 10, first, a substrate 60 including a first surface 60*a* and a second surface 60*b* opposite to the first surface 60*a* is prepared. The substrate 60 is, for example, a semiconductor substrate. More specifically, the substrate 60 is a silicon substrate.

As shown in FIG. 4A, grooves 61 and 62 for forming the electrodes 21 and 22 are formed on a first surface 60*a* side of the substrate 60 by lithography and etching. For example, when a pair of electrodes 21 and 22 are formed, a pair of grooves 61 and 62 corresponding to the pair of electrodes 21 and 22, respectively, are formed. Widths of the grooves 61 and 62 may be appropriately set according to widths of the electrodes 21 and 22 (a length of the through hole 16 in the width direction). Depths of the grooves 61 and 62 may be appropriately set according to lengths of the electrodes 21 and 22 in the axial direction.

Figure 4D:
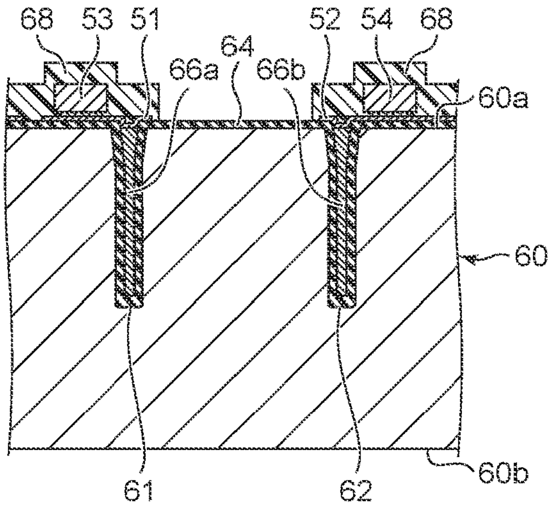
Figure 4B:
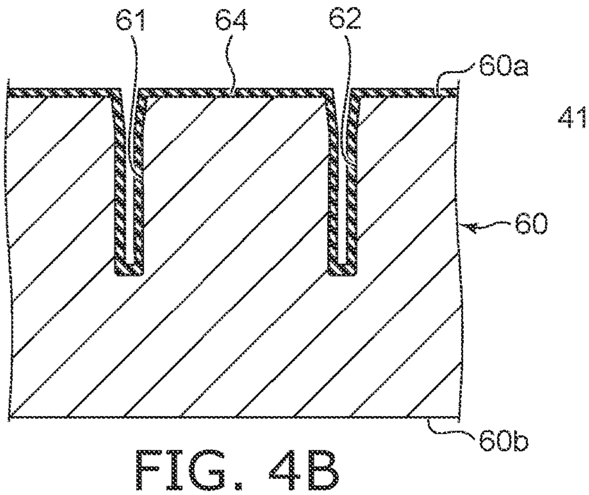

As shown in FIG. 4B, after the grooves 61 and 62 are formed, an insulating layer 64 is formed over an entire surface on the first surface 60*a* side of the substrate 60 in which the grooves 61 and 62 are formed. The insulating layer 64 is, for example, a silicon oxide film.

Figure 4E:
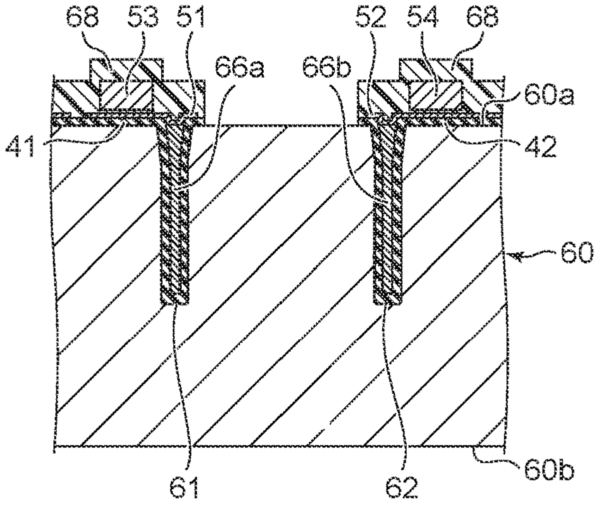
Figure 4C:
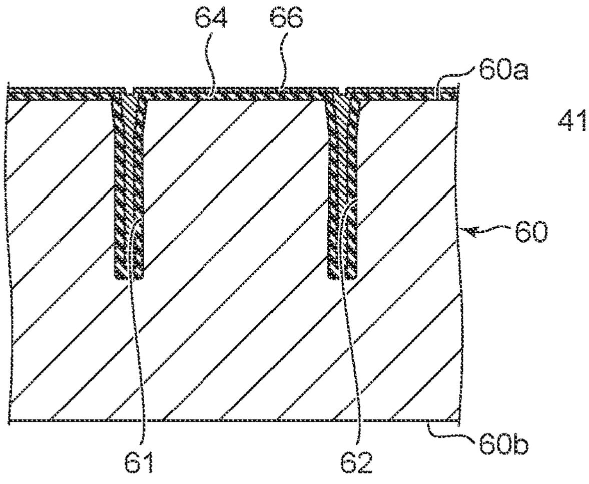

As shown in FIG. 4C, after the insulating layer 64 is formed, a metal layer 66 is formed on the insulating layer 64. The metal layer 66 is formed by, for example, a chemical vapor deposition (CVD) method, an atomic layer deposition (ALD) method, a vapor phase growth method, a sputtering method, or a plating method. A material of the metal layer 66 is, for example, W, Au, Cu, TiN, or Al.

Thus, when the metal layer 66 is formed, a speed of formation of the metal layer 66 proceeding from both sides of the grooves 61 and 62 tends to be faster on an upper side of the grooves 61 and 62 than on a bottom side of the grooves 61 and 62. Therefore, there is a possibility that the metal layer 66 on the upper side of the grooves 61 and 62 is closed first before the metal layer 66 sufficiently fills the bottom side of the grooves 61 and 62. That is, there is a possibility that a hollow shape like the electrode 21 shown in FIG. 3 is formed in the metal layer 66 in the grooves 61 and 62.

As shown in FIG. 4D, after forming the metal layer 66, conductive portions 66*a* and 66*b* embedded in the grooves 61 and 62 are formed from the metal layer 66 by removing a portion of the metal layer 66 by etching. The conductive portions 66*a* and 66*b* are portions to become the electrodes 21 and 22 later. Thus, the conductive portions 66*a* and 66*b* are formed inside the grooves 61 and 62.

As shown in FIG. 4D, after the conductive portions 66*a* and 66*b* are formed, the wiring layers 51 and 52 and the connection electrodes 53 and 54 are formed on the first surface 60*a* side of the substrate 60 as necessary. Thereafter, a resist 68 patterned in a shape corresponding to the through hole 16 is provided on the first surface 60*a* side of the substrate 60. At this time, a width of an opening of the resist 68 is smaller than that of a portion between the grooves 61 and 62. The width of the opening of the resist 68 is set according to, for example, the width of the through hole 16 set by the second portion 32 of the substrate main body 14.

As shown in FIG. 4E, the insulating layers 41 and 42 are formed from the insulating layer 64 by etching using the resist 68 as a mask and removing a portion of the insulating layer 64.

Figure 4F:
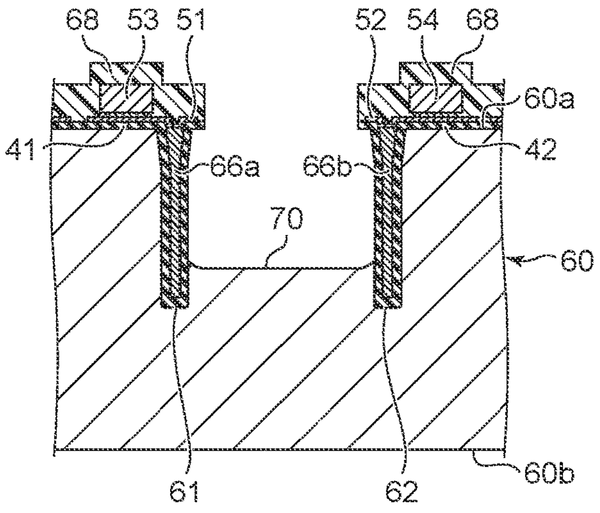

As shown in FIG. 4F, by changing an etching condition and etching the substrate 60 using the resist 68 as a mask, a groove 70 to be a portion of the through hole 16 is formed side by side with the conductive portions 66*a* and 66*b* on the first surface 60*a* side of the substrate 60. At this time, the groove 70 is formed in the middle of the grooves 61 and 62. In other words, the groove 70 is formed shallower than the grooves 61 and 62.

At this time, the insulating layers 41 and 42 formed on side surfaces of the grooves 61 and 62 are exposed by performing etching with a strong (long) isotropy such that a width of the groove 70 is larger than the width of the opening of the resist 68. In this case, a shape of the groove 70 is determined by the insulating layers 41 and 42 based on a selection ratio between the substrate 60 and the insulating layers 41 and 42.

Figure 5A:
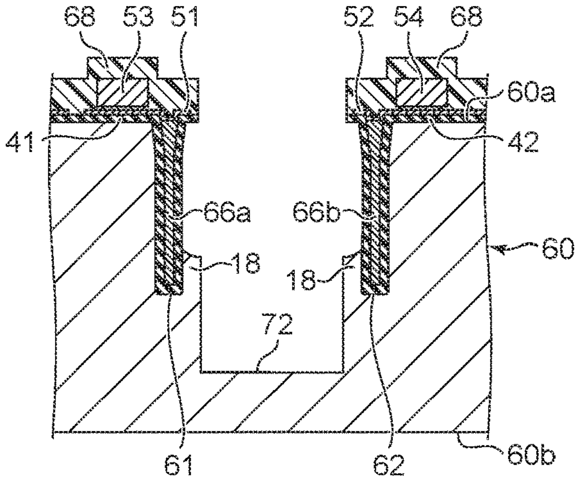
FIGS. 5A to 5F are cross-sectional views schematically showing an example of a manufacturing process for the electronic device according to the first embodiment.

As shown in FIG. 5A, a groove 72 corresponding to the mask shape of the resist 68 is formed in the groove 70 by switching to an etching condition having a large anisotropy after forming the groove 70 and etching the substrate 60 again using the resist 68 as a mask. Deep digging process such as deep reactive ion etching (RIE) is used to form the groove 72. In this case, for example, as shown in the enlarged view in FIG. 3, there is a possibility that wavy unevenness or the like is formed on an inner side surface of the groove 72.

Thus, the substrate 60 is etched while changing the condition, and a portion of the substrate 60 is intentionally left on portions of the conductive portions 66*a* and 66*b* on the bottom side of the grooves 61 and 62. Accordingly, the facing portion 18 is formed by the portion of the substrate 60 left on the bottom side of the grooves 61 and 62, disposed at a position closer to a width direction center of the groove 72 (through hole 16) than are the conductive portions 66*a* and 66*b*, and faces portions of the conductive portions 66*a* and 66*b* on one end side in the axial direction.

Figure 5D:
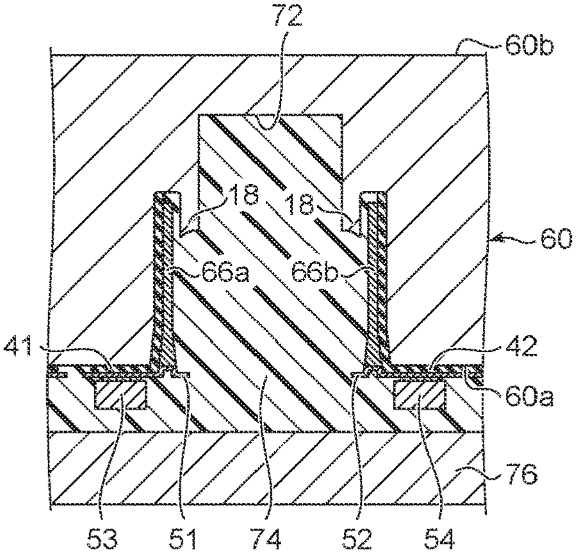
Figure 5B:
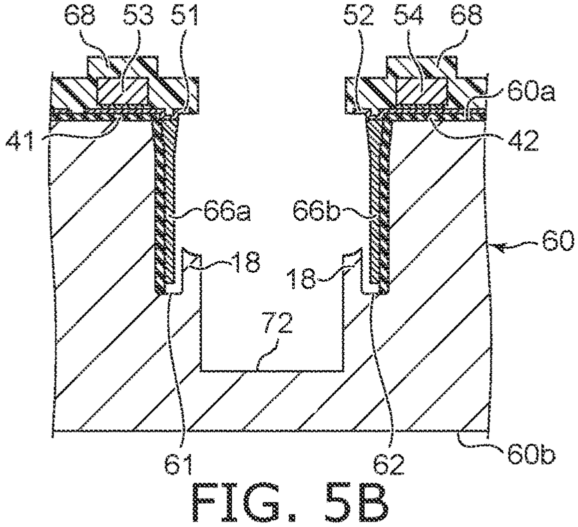

As shown in FIG. 5B, after the groove 72 is formed, the conductive portions 66*a* and 66*b* are exposed to a groove 70 side by etching portions of the insulating layers 41 and 42 facing the groove 70. Accordingly, a gap corresponding to thicknesses of the insulating layers 41 and 42 is provided between the facing portion 18 and the conductive portions 66*a* and 66*b*. In the etching of the insulating layers 41 and 42, for example, an etchant containing fluorine is used.

Figure 5E:
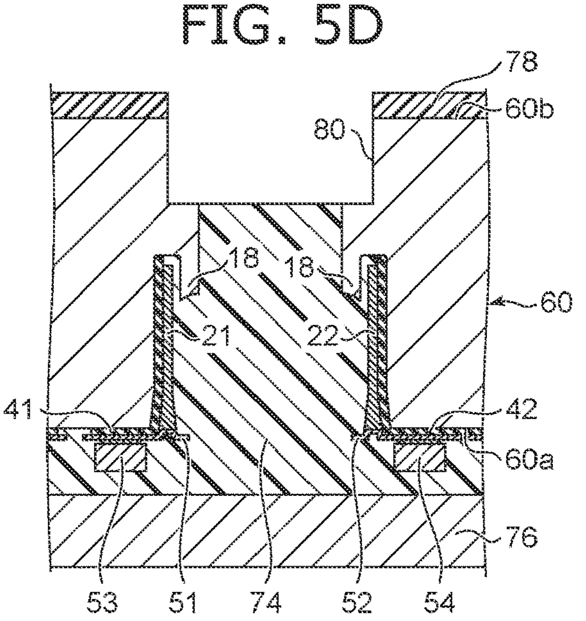
Figure 5C:
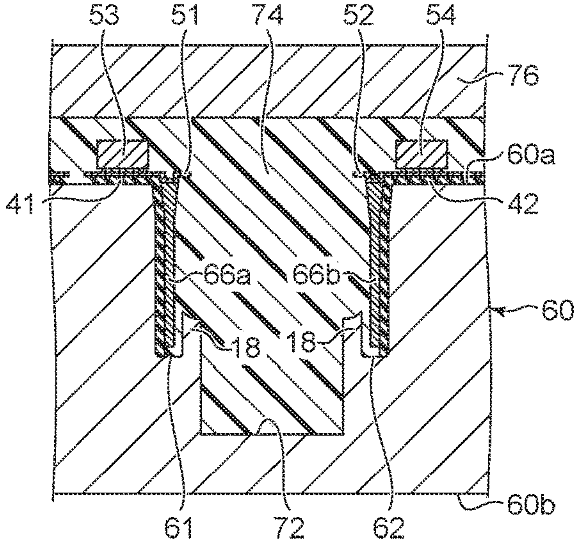

As shown in FIG. 5C, after exposing the conductive portions 66*a* and 66*b*, the first surface 60*a* side of the substrate 60 is adhered to a support substrate 76 by applying an adhesive 74 to the first surface 60*a* side of the substrate 60 and performing a heat treatment, a crimping treatment, and the like. The support substrate 76 is, for example, a glass substrate. A temperature of the heat treatment of the adhesive 74 is, for example, about 100° C. to 300° C.

As shown in FIG. 5D, after the substrate 60 adheres to the support substrate 76, a thickness of the entire substrate 60 is reduced by etching the substrate 60 from a second surface 60*b* side of the substrate 60. The substrate 60 is subjected to so-called back grinding.

When the substrate 60 is a semiconductor substrate, the thickness of the substrate 60 is, for example, 700 μm or more. In this case, it is difficult to form the through hole 16 in the substrate 60 by processing once. Therefore, as described above, back grinding is performed to reduce the thickness of the entire substrate 60. For example, the second surface 60*b* side is etched such that the thickness of the substrate 60 is about 100 μm to 500 μm. In FIGS. 4 and 5, the thickness of the substrate 60 is the same for convenience.

As shown in FIG. 5E, a resist 78 patterned into a shape corresponding to the through hole 16 is provided on the second surface 60*b* side of the substrate 60. At this time, a width of an opening of the resist 78 is larger than a width of the groove 72. The width of the opening of the resist 78 is set according to, for example, the width of the through hole 16 set by the third portion 33 of the substrate main body 14.

As shown in FIG. 5E, the substrate 60 is etched from the second surface 60*b* side using the resist 78 as a mask to form a groove 80 reaching the groove 72 from the second surface 60*b* side. In other words, a bottom of the groove 80 is connected to a bottom of the groove 72. Accordingly, the through hole 16 penetrating the substrate 60 is formed by the grooves 70, 72, and 80, and the electrodes 21 and 22 provided in the through hole 16 in the substrate 60 and extending along the axial direction of the through hole 16 are formed from the conductive portions 66*a* and 66*b*.

Figure 5F:
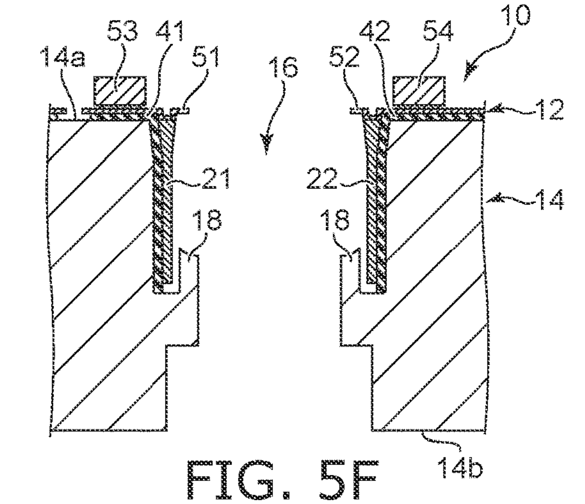

As shown in FIG. 5F, the adhesive 74 and the support substrate 76 are removed. For example, the first surface 60*a* side of the substrate 60 is supported by an adhesive tape or the like, the support substrate 76 is peeled off, and the adhesive 74 is removed by a solvent, ashing, or the like. Thereafter, for example, the substrate 60 is cut to a required size, and the substrate 12 described above is formed from the substrate 60. According to the above, the electronic device 10 is manufactured.

Thus, the method for manufacturing the electronic device 10 includes a process of forming the grooves 61 and 62 (first grooves) on the first surface 60*a* side of the substrate 60 including the first surface 60*a* and the second surface 60*b* opposite to the first surface 60*a* (for example, the process shown in FIG. 4A).

The method for manufacturing the electronic device 10 includes a process of forming the conductive portions 66*a* and 66*b* inside the grooves 61 and 62 (for example, the process shown in FIGS. 4C and 4D).

The method for manufacturing the electronic device 10 includes a process of forming the grooves 70 and 72 (second grooves) side by side with the conductive portions 66*a* and 66*b* on the first surface 60*a* side of the substrate 60, exposing at least a portion of the conductive portions 66*a* and 66*b* to grooves 70 and 72 side, and forming, on the grooves 70 and 72 side of the conductive portions 66*a* and 66*b*, the facing portion 18 facing a portion of the conductive portions 66*a* and 66*b* on the second surface 60*b* side in the direction in which the conductive portions 66*a* and 66*b* and the grooves 70 and 72 are arranged side by side (for example, the process shown in FIGS. 4F, 5A and 5B).

The method for manufacturing the electronic device 10 includes a process of adhering the support substrate 76 to the first surface 60*a* side of the substrate 60 via the adhesive 74 (for example, the process shown in FIG. 5C).

The method for manufacturing the electronic device 10 includes a process of forming the through hole 16 penetrating the substrate 60 by forming the groove 80 (third groove) reaching the groove 72 on the second surface 60*b* side of the substrate 60, and forming, from the conductive portions 66*a* and 66*b*, the electrodes 21 and 22 provided in the through hole 16 in the substrate 60 and extending along the axial direction of the through hole 16 (for example, the process shown in FIG. 5E).

The method for manufacturing the electronic device 10 includes a process of removing the support substrate 76 and the adhesive 74 (for example, the process shown in FIG. 5F).

The process of forming the through hole 16 includes leaving at least a portion of the facing portion 18. In other words, the process of forming the through hole 16 includes forming the facing portion 18 that is disposed at a position closer to the width direction center of the through hole 16 than are the conductive portions 66*a* and 66*b* and faces, in the width direction, a portion of the conductive portions 66*a* and 66*b* on the one end side in the axial direction based on the facing portion 18 that faces, in the direction in which the conductive portions 66*a* and 66*b* and the grooves 70 and 72 are arranged side by side, portions of the conductive portions 66*a* and 66*b* on the second surface 60*b* side.

The process of forming the grooves 70 and 72 (second grooves) and the facing portion 18 includes forming the groove 70 (first recess) whose depth is smaller than the depths of the grooves 61 and 62 (first grooves), forming, in the groove 70, the groove 72 (second recess) whose width is smaller than the width of the groove 70 and whose depth is larger than the depths of the grooves 61 and 62, and forming a portion of the substrate 60 left between the conductive portions 66*a* and 66*b* and the groove 72 as the facing portion 18.

The process of forming the through hole 16 includes making a width of the groove 80 (third groove) larger than the width of the groove 72.

Figure 6:
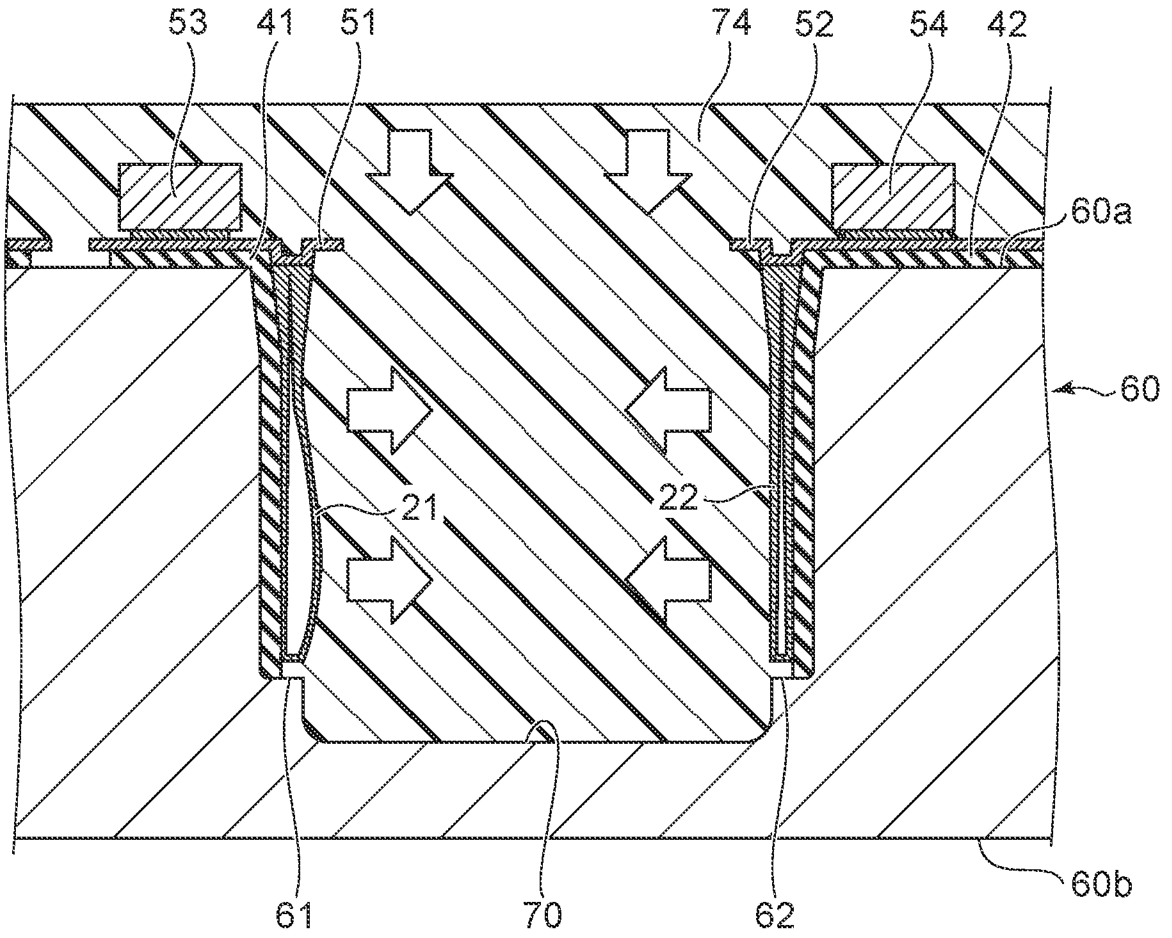
FIG. 6 is a cross-sectional view schematically showing an example of a reference manufacturing process for the electronic device.

FIG. 6 is a cross-sectional view schematically showing an example of a reference manufacturing process for the electronic device.

As shown in FIG. 6, in the reference manufacturing process, the groove 70 is formed deeper than the grooves 61 and 62. In the reference manufacturing process, for example, when forming the groove 70 to be a portion of the through hole 16 from the first surface 60*a* side of the substrate 60, the groove 70 deeper than the grooves 61 and 62 is formed by etching once. Therefore, the facing portion 18 is not formed in the reference manufacturing process.

When the substrate 60 adheres to the support substrate 76 by the adhesive 74, the adhesive 74 shrinks due to the heat treatment or the like. At this time, since surfaces of the electrodes 21 and 22 facing the groove 70 side are in direct contact with the adhesive 74, stress or strain due to the shrinkage of the adhesive 74 are applied to the electrodes 21 and 22. An influence of the stress or strain due to the shrinkage of the adhesive 74 is more obvious on the bottom side (second surface 60*b* side) of the grooves 61 and 62 than on the upper side (first surface 60*a* side) of the grooves 61 and 62.

As in the reference example shown in FIG. 6, when ends of the electrodes 21 and 22 on the bottom side of the grooves 61 and 62 are in contact with the adhesive 74 having the width of the groove 70, there is a possibility that the stress or strain applied to the ends of the electrodes 21 and 22 is large and the electrodes 21 and 22 are deformed. In particular, in the hollow electrodes 21 and 22, there is a possibility that a portion on a bottom side of the conductive portion on the groove 70 side is broken. Such deformation of the electrodes 21 and 22 reduces reliability of the electronic device. For example, a yield of the electronic device is reduced.

In this regard, in the electronic device 10 and the method for manufacturing the same according to the embodiment, the facing portion 18 is disposed at the position closer to the width direction center of the groove 72 (through hole 16) than are the electrodes 21 and 22 (conductive portions 66*a* and 66*b*) and faces the portions of the electrodes 21 and 22 (conductive portions 66*a* and 66*b*) on the one end side in the axial direction. Accordingly, for example, a thickness of the adhesive 74 in contact with the ends of the electrodes 21 and 22 (conductive portions 66*a* and 66*b*) on the bottom side of the grooves 61 and 62 can be reduced to the thicknesses of the insulating layers 41 and 42.

The strain caused by the shrinkage of the adhesive 74 depends on the thickness (length) of the adhesive 74. As the thickness of the adhesive 74 decreases, the strain caused by the shrinkage of the adhesive 74 decreases. In the embodiment, central portions of the electrodes 21 and 22 (conductive portions 66*a* and 66*b*) in the axial direction are in contact with the adhesive 74 embedded with the width of the groove 70, whereas the thickness of the adhesive 74 in contact with the electrodes 21 and 22 (conductive portions 66*a* and 66*b*) can be the thicknesses of the insulating layers 41 and 42 on bottoms of the grooves 61 and 62. Therefore, in the electrodes 21 and 22 (conductive portions 66*a* and 66*b*), it is possible to reduce the strain applied to the portion, on which stress is likely to be concentrated and which is likely to be broken, on the bottom side of the grooves 61 and 62.

Accordingly, in the electronic device 10 and the method for manufacturing the same according to the embodiment, the deformation of the electrodes 21 and 22 (conductive portions 66*a* and 66*b*) can be prevented, and high reliability can be attained. The yield of the electronic device 10 can be improved.

In the configuration of the reference example in which the facing portion 18 is not provided, the ends of the electrodes 21 and 22 on the second surface 14*b* side are exposed to the through hole 16. Therefore, for example, when applied to an electron beam control device, a component that is not perpendicular to the electrodes 21 and 22 may be generated in an electromagnetic field that controls an electron beam. There is a concern that the component not perpendicular to the electrodes 21 and 22 in the electromagnetic field may influence controllability of the electron beam.

In the electronic device 10 according to the embodiment, the potential of the facing portion 18 can be substantially equal to the potential of the substrate main body 14. For example, the substrate main body 14 and the facing portion 18 can be set to a ground potential. Accordingly, for example, places substantially perpendicular to the electrodes 21 and 22 are set as a start point and an end point in the electromagnetic field, and it is possible to prevent generation of a component not perpendicular to the electrodes 21 and 22 in the electromagnetic field that controls the electron beam. Accordingly, for example, when the electronic device 10 is applied to the electron beam control device, the electron beam can be controlled more easily.

In the embodiment, the substrate main body 14 further includes the third portion 33 that is located between the second portion 32 and the second surface 14*b* and where the width of the through hole 16 is larger than the width of the through hole 16 in the second portion 32. The third portion 33 is formed by forming the groove 80 whose width is larger than the width of the groove 72 from the second surface 60*b* side of the substrate 60. Thus, by forming the groove 80, for example, when the groove 80 is formed from the second surface 60*b* side of the substrate 60, misalignment between the groove 80 and the groove 72 can be prevented, and the through hole 16 can be more appropriately formed.

In the embodiment, the axial direction length D1 of the portion of the facing portion 18 facing the portions of the electrodes 21 and 22 is larger than the distance D2 between the facing portion 18 and the substrate main body 14 in the width direction. Accordingly, it is possible to more appropriately prevent the influence of the stress or strain applied to the ends of the electrodes 21 and 22 and to more appropriately prevent deformation of the electrodes 21 and 22.

Figure 7A:
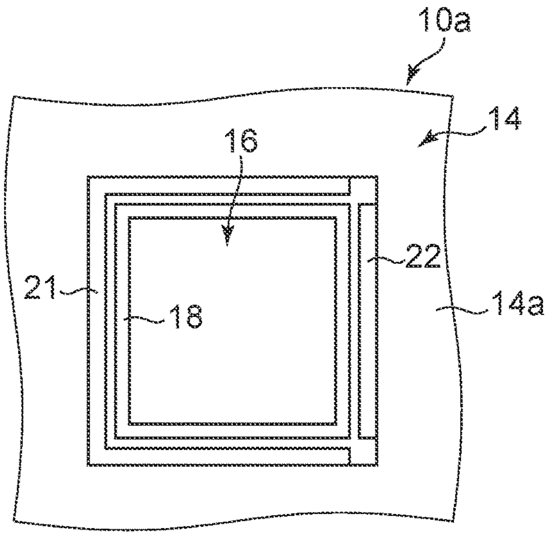
FIGS. 7A to 7C are plan views schematically showing variations of the electronic device according to the first embodiment.
Figure 7B:
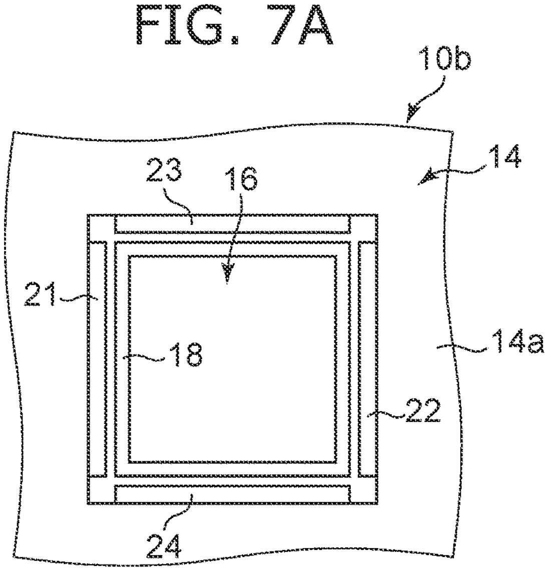
Figure 7C:
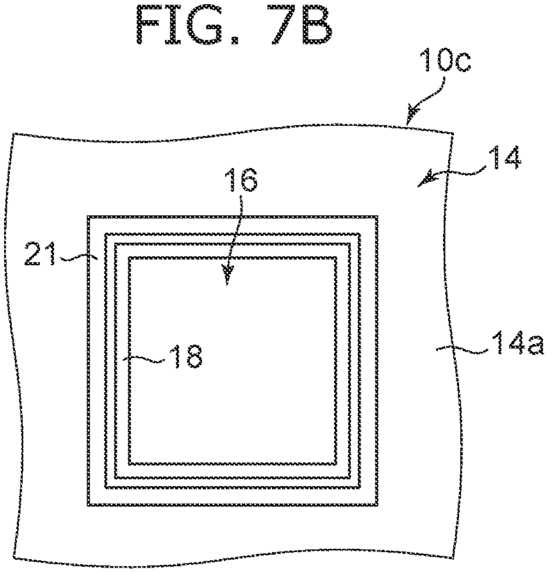

FIGS. 7A to 7C are plan views schematically showing variations of the electronic device according to the first embodiment.

Functions and configurations substantially the same as those in the above-described embodiment are denoted by the same reference signs, and detailed description thereof is omitted.

As shown in FIG. 7A, in an electronic device 10*a*, the electrode 21 is provided along three adjacent sides of the quadrangular through hole 16 when viewed in the axial direction. The electrode 21 has, for example, a substantial U-shape as viewed in the axial direction.

Thus, the shape of each of the electrodes 21 and 22 as viewed in the axial direction is not limited to a linear shape, and may be, for example, a bent shape or a curved shape. The shape of each of the electrodes 21 and 22 as viewed in the axial direction may be any shape depending on, for example, the shape of the through hole 16 as viewed in the axial direction and use of the electronic device 10*a*.

As shown in FIG. 7B, an electronic device 10*b* further includes electrodes 23 and 24. The electrodes 21 and 22 extend along two facing sides of the quadrangular through hole 16, and the electrodes 23 and 24 extend along the other two facing sides of the quadrangular through hole 16. In other words, the electronic device 10*b* includes two pairs of electrodes 21 to 24.

The number of electrodes provided in the electronic device is not limited to one pair, and may be two or more pairs. The number of multiple electrodes provided in one through hole 16 of the electronic device is not limited to that described above, and may be any number. The number of the multiple electrodes provided in one through hole 16 of the electronic device may be appropriately set according to, for example, use of the electronic device.

As shown in FIG. 7C, the electronic device 10*c* includes only one electrode 21 extending along the circumferential direction of the through hole 16 and surrounding the through hole 16 when viewed in the axial direction. In an electronic device 10*c*, the electrode 21 has a frame shape surrounding the through hole 16 when viewed in the axial direction. Thus, the number of electrodes provided in the through hole 16 may be one. The shape of the one electrode provided in the through hole 16 is not limited to that described above, and may be any shape.

Figure 8:
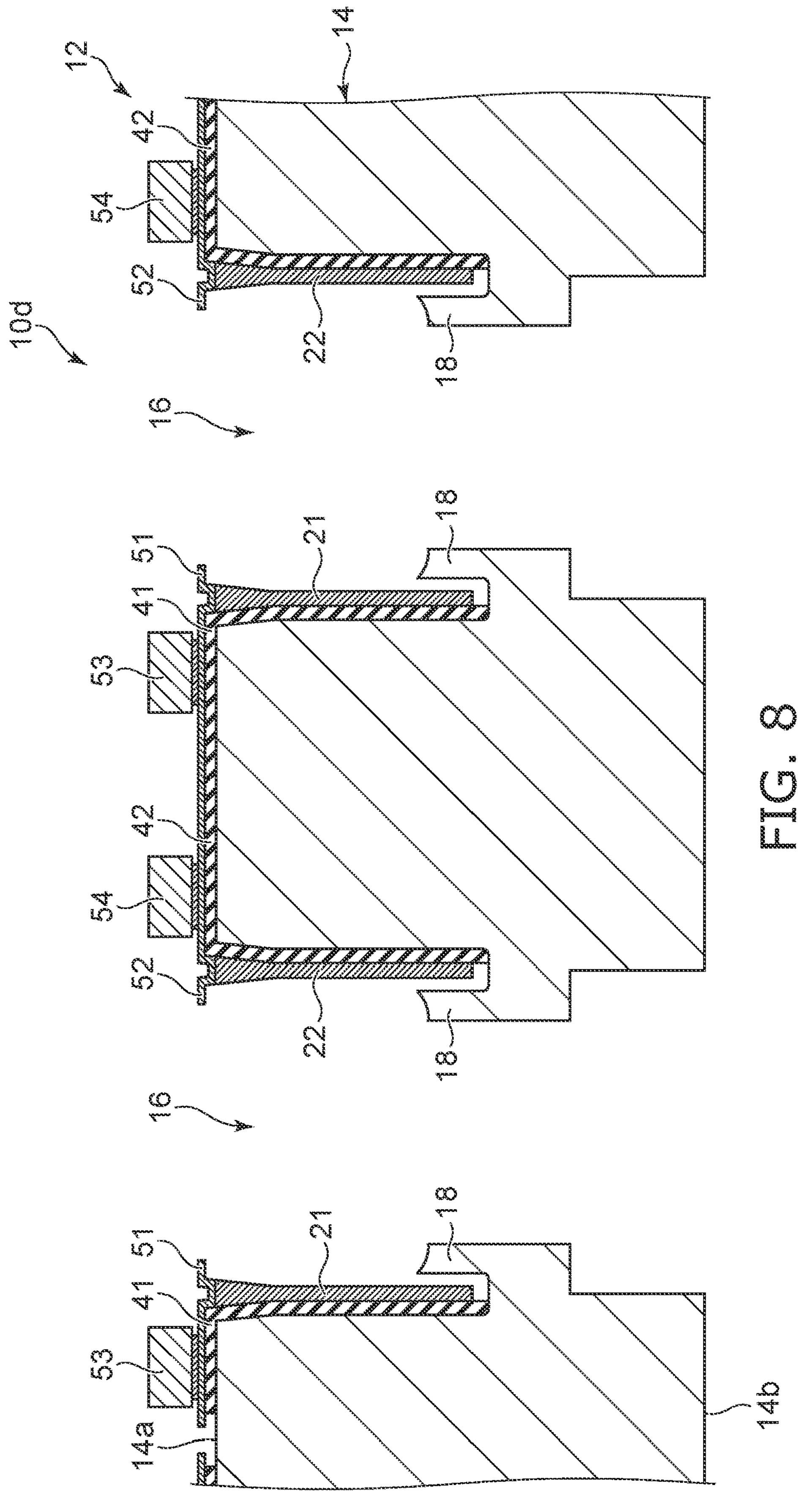
FIG. 8 is a cross-sectional view schematically showing a variation of the electronic device according to the first embodiment.

FIG. 8 is a cross-sectional view schematically showing a variation of the electronic device according to the first embodiment.

As shown in FIG. 8, in an electronic device 10*d*, the substrate 12 has multiple through holes 16. The electronic device 10*d* includes multiple electrodes 21 and 22 provided in the multiple through holes 16, respectively. In the electronic device 10*d*, the substrate 12 includes multiple facing portions 18 each provided corresponding to a respective one of the multiple through holes 16.

Thus, the electronic device 10*d* may have multiple through holes 16. The number of through holes 16 provided in the electronic device 10*d* may be any number. The number of the through holes 16 provided in the electronic device 10*d* may be appropriately set according to, for example, use of the electronic device 10*d*.

Figure 9:
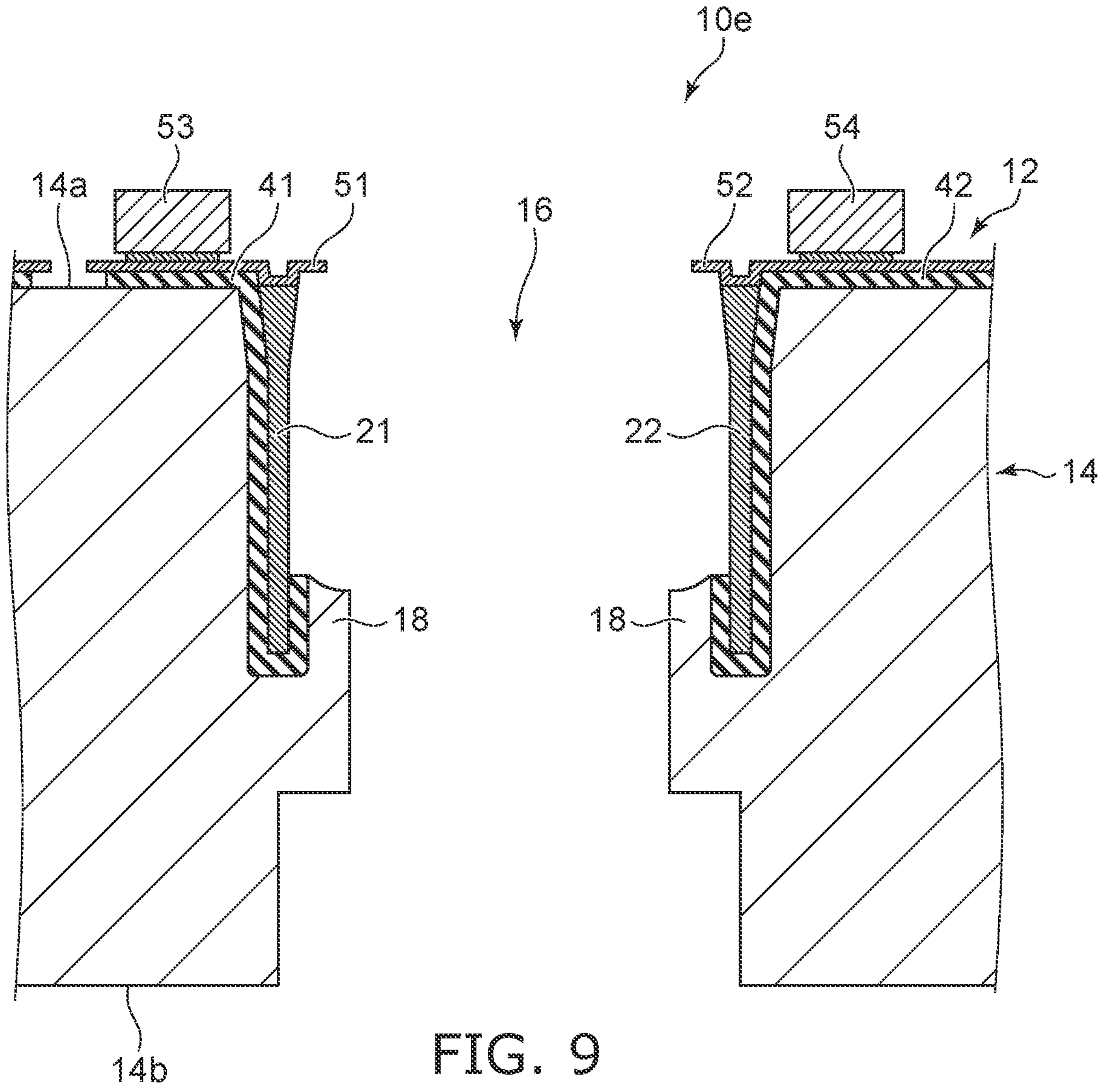
FIG. 9 is a cross-sectional view schematically showing a variation of the electronic device according to the first embodiment.

FIG. 9 is a cross-sectional view schematically showing a variation of the electronic device according to the first embodiment.

As shown in FIG. 9, in an electronic device 10*e*, the insulating layers 41 and 42 extend between the second portion 32 and the electrodes 21 and 22 and between the facing portion 18 and the electrodes 21 and 22. For example, the insulating layers 41 and 42 are in contact with the facing portion 18 while being in contact with the electrodes 21 and 22.

For example, as shown in FIG. 5B, shapes of the insulating layers 41 and 42 of the electronic device 10*e* can be formed by adjusting an etching condition of the insulating layers 41 and 42 when etching portions of the insulating layers 41 and 42 facing the groove 70 to expose the electrodes 21 and 22 (conductive portions 66*a* and 66*b*) to the groove 70 side.

Thus, by extending the insulating layers 41 and 42 between the facing portion 18 and the electrodes 21 and 22, it is possible to prevent entry of the adhesive 74 between the facing portion 18 and the electrodes 21 and 22. Accordingly, it is possible to more appropriately reduce the influence of the stress or strain applied to the ends of the electrodes 21 and 22 and to more appropriately prevent the deformation of the electrodes 21 and 22.

For example, the insulating layers 41 and 42 are in contact with the facing portion 18 while being in contact with the electrodes 21 and 22. Accordingly, it is possible to further prevent the entry of the adhesive 74 between the facing portion 18 and the electrodes 21 and 22, and to more appropriately prevent the deformation of the electrodes 21 and 22.

Figure 10A:
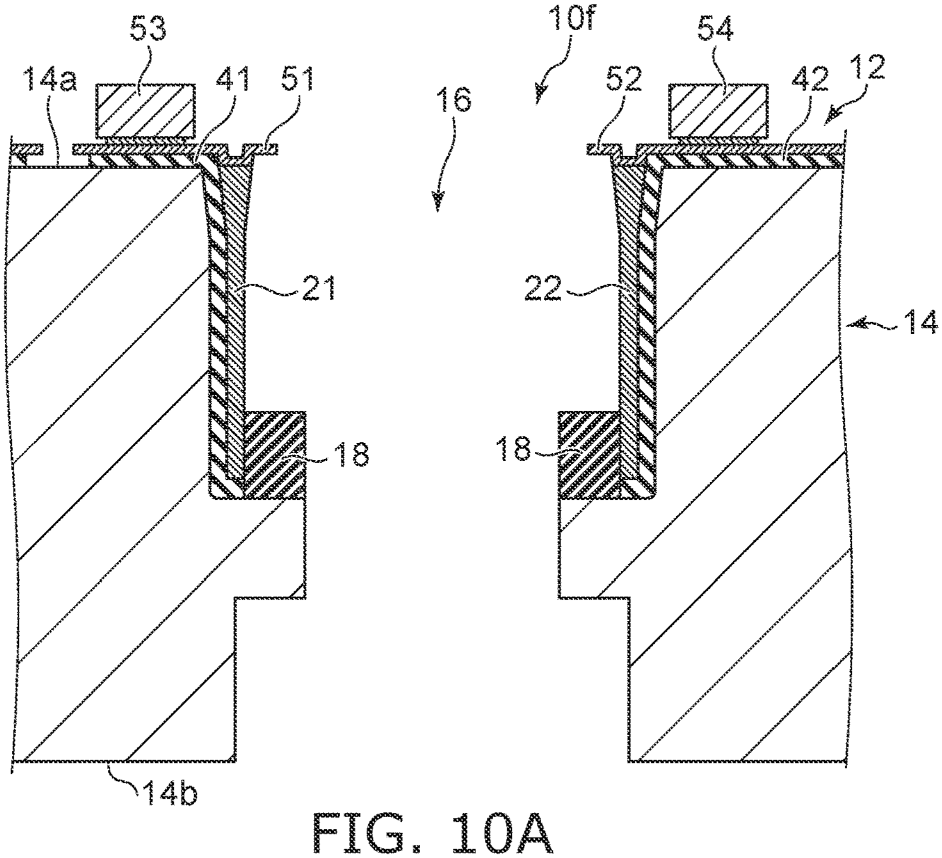
FIGS. 10A and 10B are cross-sectional views schematically showing variations of the electronic device according to the first embodiment.
Figure 10B:
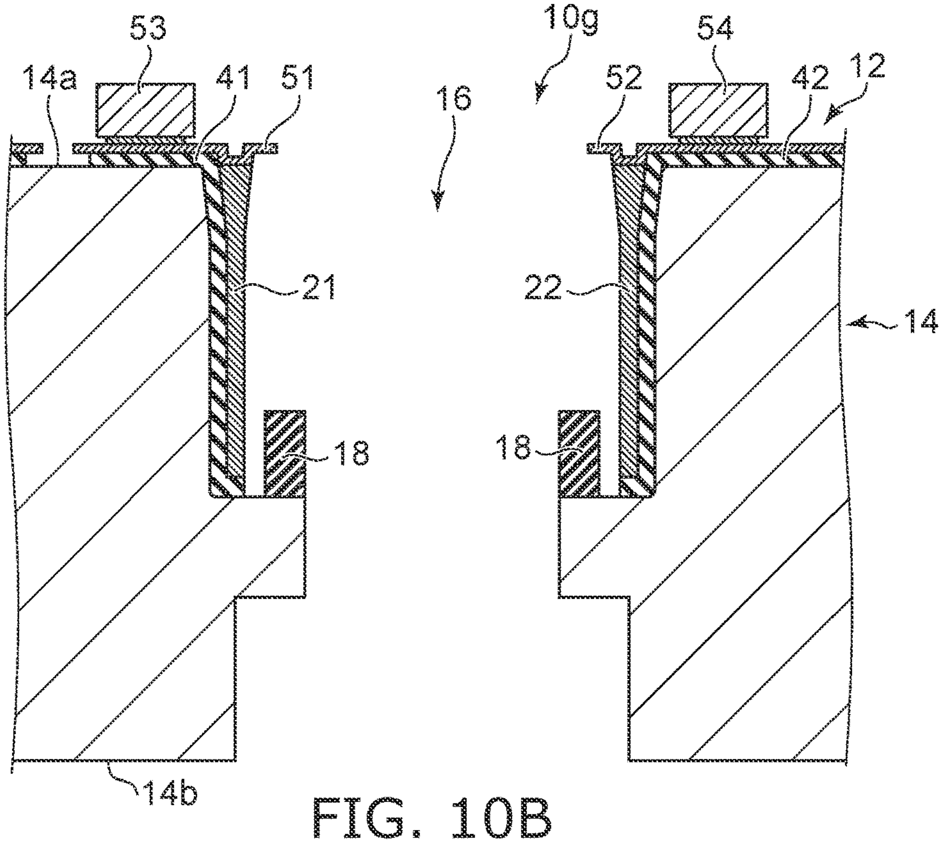

FIGS. 10A and 10B are cross-sectional views schematically showing variations of the electronic device according to the first embodiment.

As shown in FIG. 10A, in an electronic device 10*f*, the material of the facing portion 18 is different from the material of the substrate main body 14 (substrate 12). In the electronic device 10*f*, the material of the facing portion 18 is, for example, an insulator. Insulation of the facing portion 18 is, for example, higher than insulation of the substrate main body 14. In addition, in the electronic device 10*f*, the facing portion 18 is in contact with, for example, the electrodes 21 and 22.

Thus, the material of the facing portion 18 may be different from the material of the substrate main body 14. For example, as shown in FIG. 4F, the facing portion 18 made of a material different from that of the substrate main body 14 can be formed by forming the groove 70 to be a portion of the through hole 16 in the substrate 60 to be the substrate main body 14 and then stacking another material on the substrate 60. However, in this case, for example, the depth of the groove 70 is the same as the depths of the grooves 61 and 62 or the depths of the grooves 61 and 62 are larger than the depth of the groove 70, and after exposing an entire side surface of the electrodes 21 and 22 (conductive portions 66*a* and 66*b*), another material is stacked.

When the material of the facing portion 18 is insulating, the facing portion 18 can be provided in contact with the electrodes 21 and 22. In this case, it is possible to prevent the entry of the adhesive 74 between the facing portion 18 and the electrodes 21 and 22, and to more appropriately prevent the deformation of the electrodes 21 and 22.

As in an electronic device 10*g* shown in FIG. 10B, the facing portion 18 formed of a material different from that of the substrate main body 14 may be provided separately from the electrodes 21 and 22 in the width direction. In this case, a conductive material can be used as the material of the facing portion 18. When the material of the facing portion 18 is conductive and is electrically connected to the substrate main body 14, for example, as described above, controllability of an electron beam can be improved.

Second Embodiment

Figure 11:
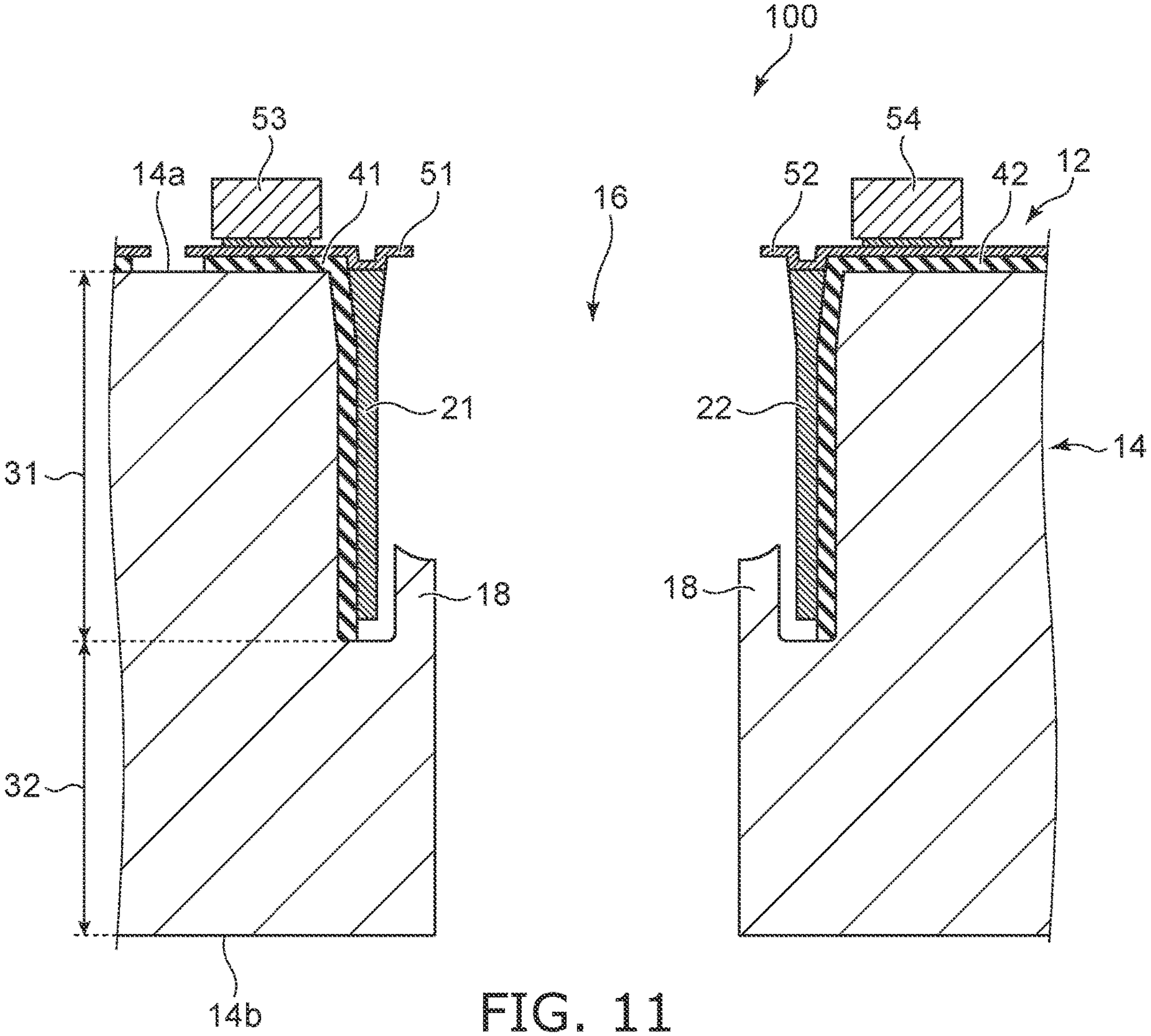
FIG. 11 is a cross-sectional view schematically showing an electronic device according to a second embodiment.

FIG. 11 is a cross-sectional view schematically showing an electronic device according to a second embodiment.

As shown in FIG. 11, in an electronic device 100, the third portion 33 is omitted in the substrate main body 14, and only the second portion 32 is provided between the first portion 31 and the second surface 14*b*.

Therefore, in the electronic device 100, the width of the through hole 16 on the one end side in the axial direction is different from the width of the through hole 16 on the other end side in the axial direction. In the electronic device 100, the width of the through hole 16 on the first surface 14*a* side is larger than the width of the through hole 16 on the second surface 14*b* side.

Figure 12A:
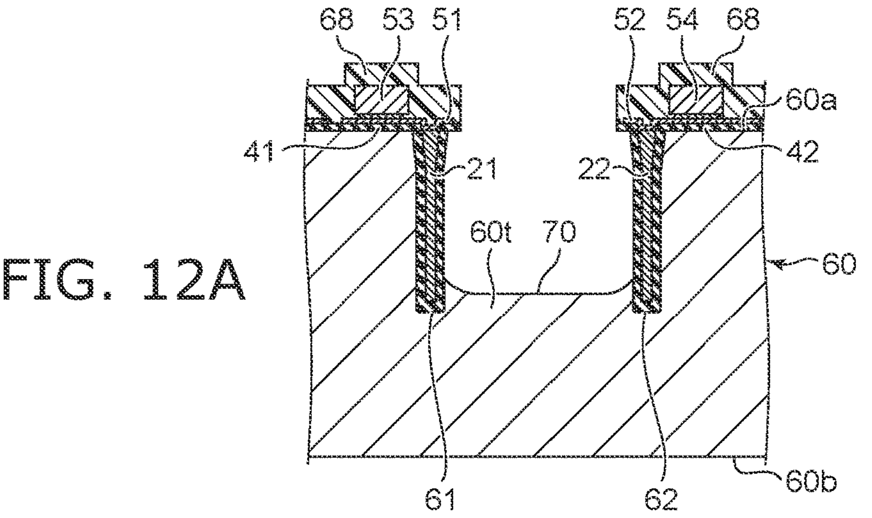
FIGS. 12A to 12C are cross-sectional views schematically showing an example of a manufacturing process for the electronic device according to the second embodiment.
Figure 12B:
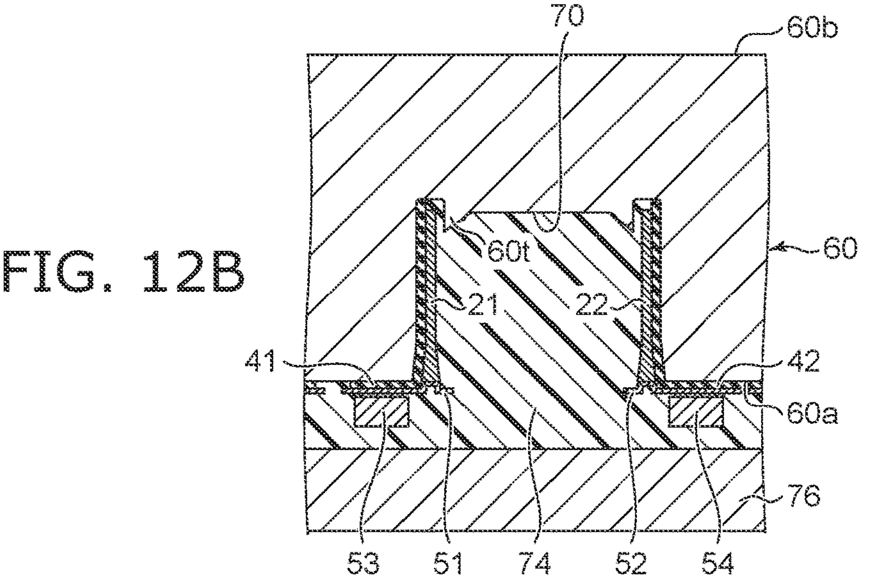
Figure 12C:
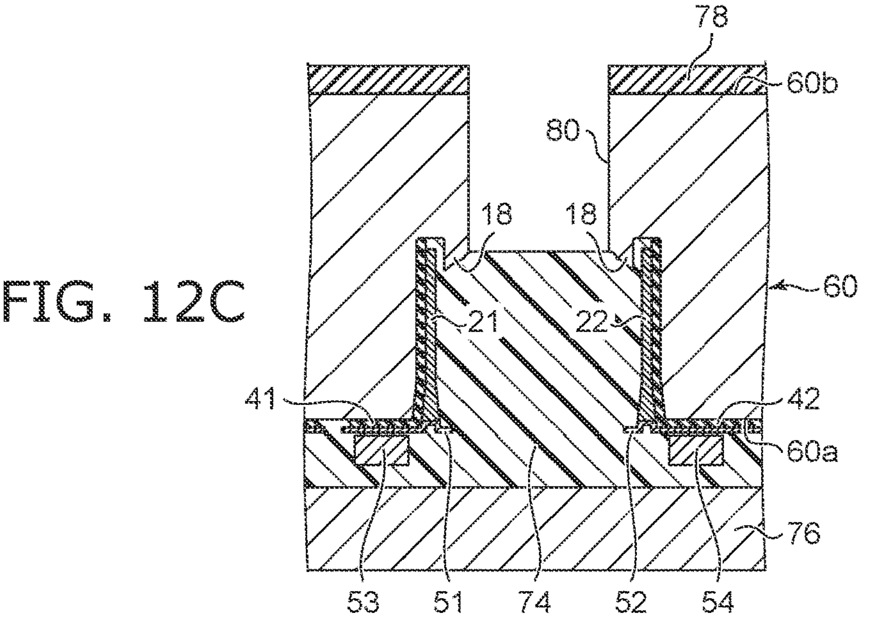

FIGS. 12A to 12C are cross-sectional views schematically showing an example of a manufacturing process for the electronic device according to the second embodiment.

As shown in FIGS. 12A and 12B, when manufacturing the electronic device 100, after formation of the groove 70, portions of the insulating layers 41 and 42 facing the groove 70 are etched without forming the groove 72. When manufacturing the electronic device 100, the depth of the groove 70 (second groove) is smaller than the depths of the grooves 61 and 62 (first groove), and a portion of the substrate 60 left between the groove 70 and the second surface 60*b* is formed as a facing portion 60*t*. After the groove 70 and the facing portion 60*t* are formed, the first surface 60*a* side of the substrate 60 adheres to the support substrate 76 by the adhesive 74.

As shown in FIG. 12C, the resist 78 patterned into a shape corresponding to the through hole 16 is provided on the second surface 60*b* side of the substrate 60. At this time, the width of the opening of the resist 78 is smaller than the width of the groove 70. The width of the opening of the resist 78 is set according to, for example, the width of the through hole 16 set by the second portion 32 of the substrate main body 14.

As shown in FIG. 12C, the substrate 60 is etched from the second surface 60*b* side using the resist 78 as a mask to form the groove 80 reaching the groove 70 from the second surface 60*b* side. In other words, the bottom of the groove 80 is connected to the bottom of the groove 70. Accordingly, the through hole 16 penetrating the substrate 60 is formed by the grooves 70 and 80. Thereafter, similarly to the first embodiment, the electronic device 100 is manufactured by removing the adhesive 74 and the support substrate 76 and cutting the substrate 60 as necessary.

Thus, the substrate main body 14 may not necessarily include the third portion 33. For example, when the depth of the groove 80 formed from the second surface 60*b* side is excessively large and it is difficult to form the groove 80, as shown in the first embodiment, it is desired to form the groove 72 in the groove 70 and reduce the depth of the groove 80 etched from the second surface 60*b* side.

In the electronic device 100, by forming the facing portion 60*t*, as in the first embodiment, it is still possible to reduce the influence of the stress or strain applied to the ends of the electrodes 21 and 22 and prevent the deformation of the electrodes 21 and 22. The highly reliable electronic device 100 can be provided.

Figure 13:
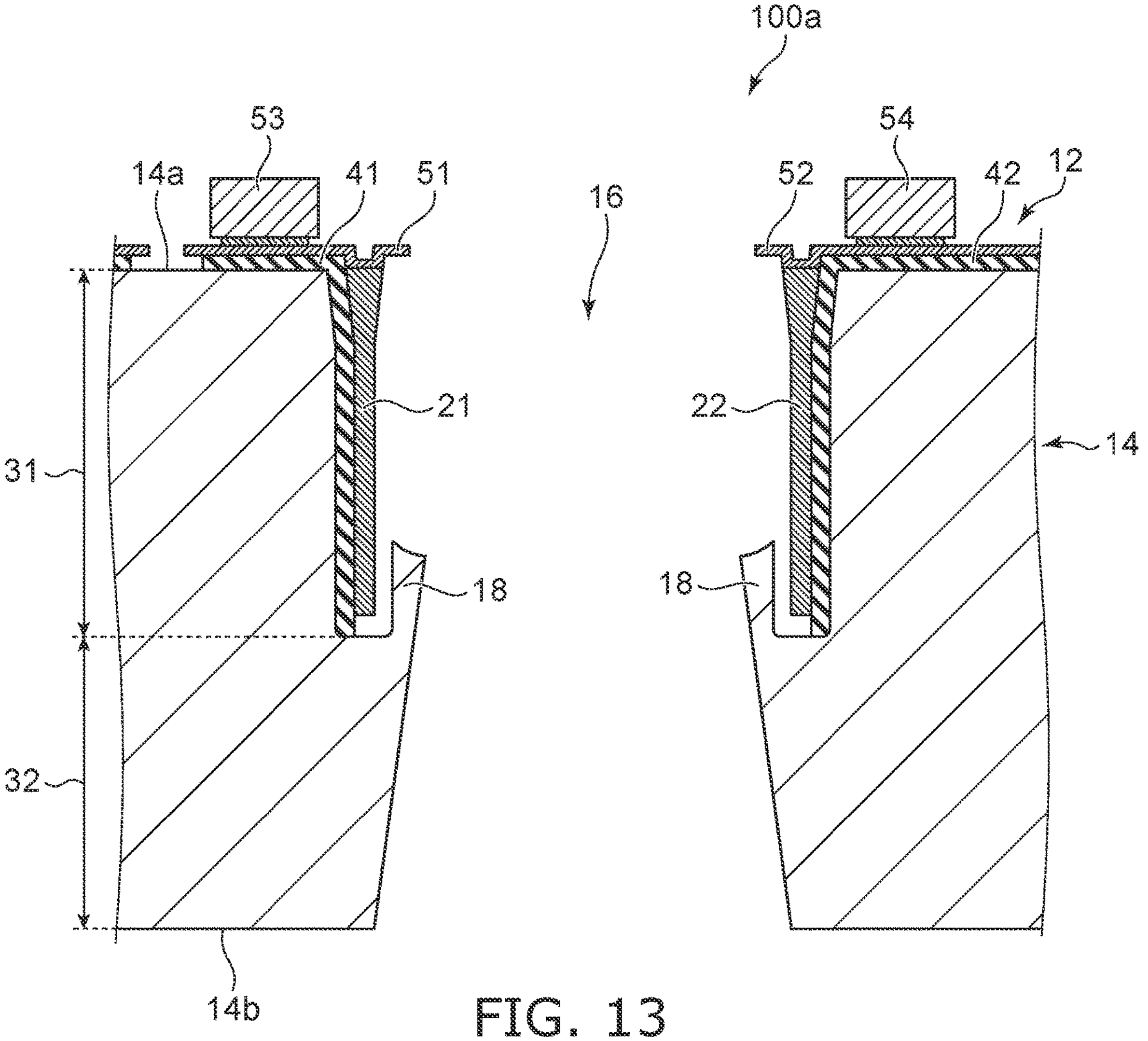
FIG. 13 is a cross-sectional view schematically showing a variation of the electronic device according to the second embodiment.

FIG. 13 is a cross-sectional view schematically showing a variation of the electronic device according to the second embodiment.

As shown in FIG. 13, in an electronic device 100*a*, in the second portion 32, the width of the through hole 16 increases from the first portion 31 toward the second surface 14*b*.

For example, as shown in FIG. 12C, the shape of the through hole 16 of the electronic device 100*a* can be formed by etching the substrate 60 from the second surface 60*b* side and gradually weakening an anisotropy condition of the etching when forming the groove 80 reaching the groove 70 from the second surface 60*b* side. In other words, the shape of the through hole 16 can be formed by gradually weakening a spread in the width direction of etching.

Thus, for example, misalignment between the groove 80 and the groove 70 can be prevented more easily by gradually decreasing the width of the groove 80 when etching is performed from the second surface 60*b* side. For example, the through hole 16 can be formed more easily.

Figure 14:
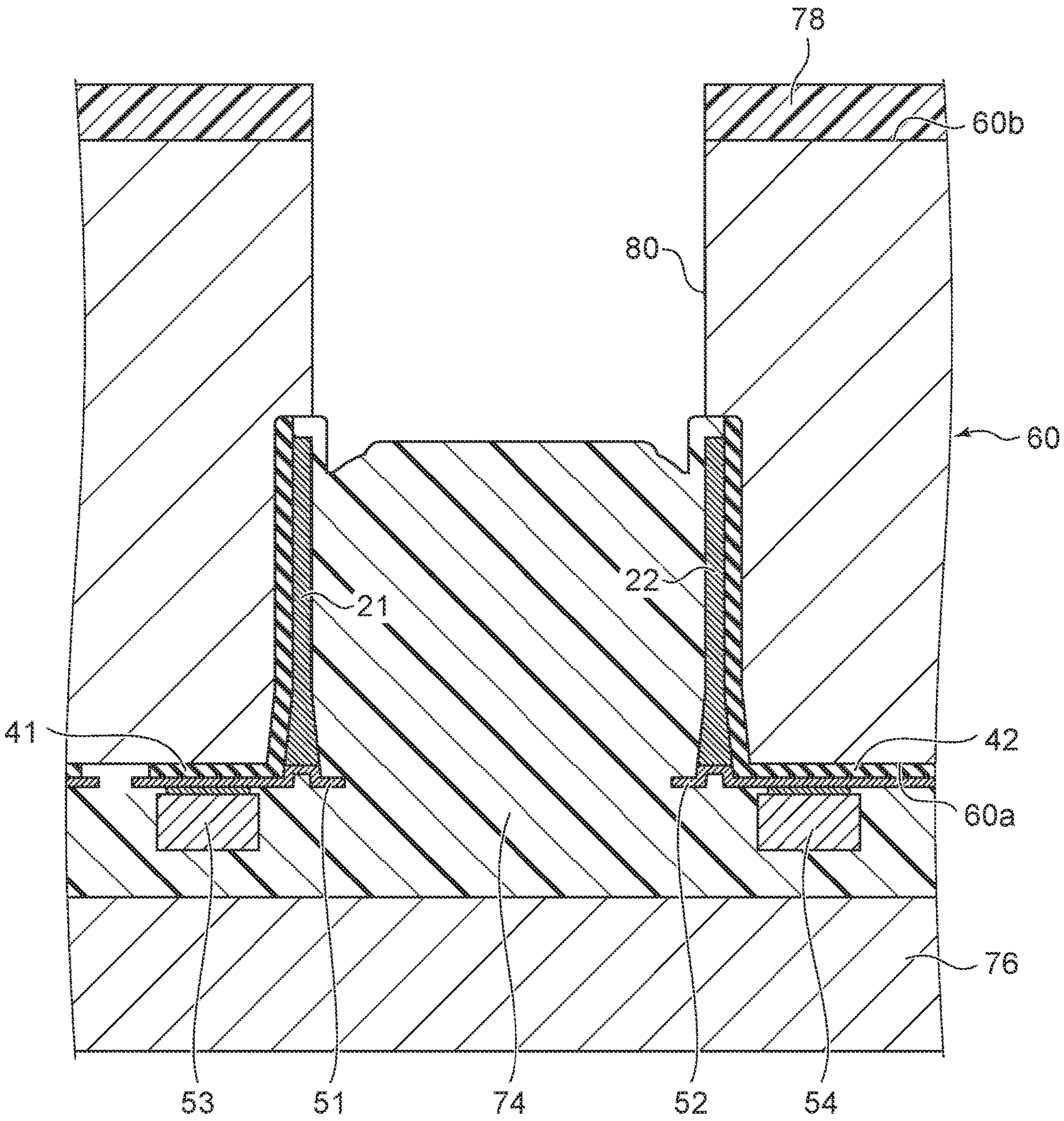
FIG. 14 is a cross-sectional view schematically showing a variation of the electronic device according to the second embodiment.

FIG. 14 is a cross-sectional view schematically showing a variation of the electronic device according to the second embodiment.

As shown in FIG. 14, in the example, the substrate 60 is etched from the second surface 60*b* side, and the facing portion 60*t* is removed when forming the groove 80 reaching the groove 70 from the second surface 60*b* side.

The facing portion 60*t* may be provided at least when the substrate 60 adheres to the support substrate 76 by the adhesive 74. Therefore, after the substrate 60 adheres to the support substrate 76, the facing portion 60*t* may be removed in the process of etching the substrate 60 from the second surface 60*b* side. In other words, the manufactured electronic device does not necessarily include the facing portion 18. Thus, the process of forming the through hole 16 may include removing the facing portion 60*t* by forming the groove 80.

According to the embodiment, an electronic device with a high reliability and a method for manufacturing the same can be provided.

In the specification of the application, "electrically connected" includes not only direct contact connection but also connection via another conductive member or the like.

Embodiments may include the following configurations.

APPENDIX 1

An electronic device comprising:

a substrate having a through hole;

an electrode provided in the through hole in the substrate and extending along an axial direction of the through hole; and a facing portion provided on the substrate, disposed at a position closer to a center of the through hole in a width direction than is the electrode, and facing, in the width direction, a portion of the electrode on one end side in the axial direction.

APPENDIX 2

The device according to Appendix 1, wherein the electrode is hollow.

APPENDIX 3

The device according to any one of Appendixes 1 and 2, further comprising:

a plurality of the electrodes provided in the through hole.

APPENDIX 4

The device according to any one of Appendixes 1 to 3, further comprising:

a plurality of the electrodes, the substrate having a plurality of the through holes, and the plurality of electrodes being each provided in a respective one of the plurality of through holes.

APPENDIX 5

The device according to any one of Appendixes 1 to 4, wherein a material of the facing portion is same as a material of the substrate.

APPENDIX 6

The device according to any one of Appendixes 1 to 4, wherein a material of the facing portion is different from a material of the substrate.

APPENDIX 7

The device according to any one of Appendixes 1 to 6, wherein a width of the through hole on the one end side in the axial direction is different from a width of the through hole on another end side in the axial direction.

APPENDIX 8

The device according to any one of Appendixes 1 to 7, wherein the facing portion is electrically connected to the substrate and is disposed at a predetermined interval from the electrode in the width direction.

APPENDIX 9

The device according to any one of Appendixes 1 to 8, wherein the substrate includes:

a first surface on the one end side of the through hole in the axial direction;

a second surface on another end side of the through hole in the axial direction;

a first portion located between the first surface and the second surface and configured to set the through hole to a predetermined width; and a second portion that is located between the first portion and the second surface and where a width of the through hole is smaller than the width of the through hole in the first portion, the electrode is provided in the through hole in the first portion, and the facing portion is provided in the second portion in a manner of extending from a position closer to the center in the width direction than is the electrode toward the one end side of the through hole.

APPENDIX 10

The device according to Appendix 9, wherein the substrate further includes a third portion that is located between the second portion and the second surface and where a width of the through hole is larger than the width of the through hole in the second portion.

APPENDIX 11

The device according to any one of Appendixes 9 and 10, wherein the substrate includes an insulating layer provided between the first portion and the electrode.

APPENDIX 12

The device according to Appendix 11, wherein the insulating layer extends between the second portion and the electrode and between the facing portion and the electrode.

APPENDIX 13

The device according to Appendix 9, wherein in the second portion, the width of the through hole increases from the first portion toward the second surface.

APPENDIX 14

The device according to any one of Appendixes 1 to 13, wherein a length of the facing portion in the axial direction at a portion facing the portion of the electrode is longer than a distance between the facing portion and a main body of the substrate in the width direction.

APPENDIX 15

A method for manufacturing an electronic device, the method comprising:

forming a first groove on a first surface side of a substrate including a first surface and a second surface opposite to the first surface;

forming a conductive portion inside the first groove;

forming a second groove on the first surface side of the substrate side by side with the conductive portion, exposing at least a portion of the conductive portion to a second groove side, and forming, on the second groove side of the conductive portion, a facing portion facing the portion of the conductive portion on the second surface side in a direction in which the conductive portion and the second groove are arranged side by side;

adhering a support substrate, via an adhesive, to the first surface side of the substrate;

forming a through hole penetrating the substrate by forming a third groove reaching the second groove on the second surface side of the substrate, and forming, from the conductive portion, an electrode provided in the through hole in the substrate and extending along an axial direction of the through hole; and removing the support substrate and the adhesive.

APPENDIX 16

The method according to Appendix 15, wherein the forming the through hole includes leaving at least a portion of the facing portion.

APPENDIX 17

The method according to Appendix 15, wherein the forming the through hole includes removing the facing portion by forming the third groove.

APPENDIX 18

The method according to any one of Appendixes 15 to 17, wherein the forming the second groove and the facing portion includes forming a first recess whose depth is smaller than a depth of the first groove, forming, in the first recess, a second recess whose width is smaller than a width of the first recess and whose depth is larger than the depth of the first groove, thereby forming the second groove by the first recess and the second recess, and forming, as the facing portion, a portion of the substrate left between the conductive portion and the second recess.

APPENDIX 19

The method according to Appendix 18, wherein the forming the through hole includes making a width of the third groove larger than the width of the second recess of the second groove.

APPENDIX 20

The method according to any one of Appendixes 15 to 17, wherein the forming the second groove and the facing portion includes forming the second groove such that a depth of the second groove is smaller than a depth of the first groove and forming, as the facing portion, a portion of the substrate left between the second groove and the second surface.

Hereinabove, embodiments of the invention are described with reference to specific examples. However, the embodiments of the invention are not limited to these specific examples. For example, the specific configurations of the components included in the electronic device are incorporated in the scope of the invention as long as a person skilled in the art appropriately selects components from the publicly known range to similarly implement the invention for obtaining the similar effect.

Further, any two or more components of the specific examples may be combined within the extent of technical feasibility and are included in the scope of the invention to the extent that the purport of the invention is included.

Moreover, all electronic devices practicable by an appropriate design modification by one skilled in the art based on the electronic devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An electronic device comprising:

a substrate having a through hole;

an electrode provided in the through hole in the substrate and extending along an axial direction of the through hole; and a facing portion provided on the substrate, disposed at a position closer to a center of the through hole in a width direction than is the electrode, and facing, in the width direction, a portion of the electrode at one end side of the electrode in the axial direction.

2. The device according to claim 1, wherein the electrode is hollow.

3. The device according to claim 1, further comprising:

one or more additional electrodes provided in the through hole.

4. The device according to claim 1, further comprising:

one or more additional electrodes, the substrate having one or more additional through holes, and the one or more additional electrodes being each provided in a respective one of the one or more additional through holes.

5. The device according to claim 1, wherein a material of the facing portion is the same as a material of the substrate.

6. The device according to claim 1, wherein a material of the facing portion is different from a material of the substrate.

7. The device according to claim 1, wherein a width of the through hole on a first end side of the through hole in the axial direction is different from a width of the through hole on a second end side of the through hole in the axial direction.

8. The device according to claim 1, wherein the facing portion is electrically connected to the substrate and is disposed at a predetermined interval from the electrode in the width direction.

9. The device according to claim 1, wherein a length of the facing portion in the axial direction at a portion facing the portion of the electrode is longer than a distance between the facing portion and a main body of the substrate in the width direction.

10. The device according to claim 1, wherein the substrate includes:

a first surface;

a second surface opposite to the first surface;

a first portion located between the first surface and the second surface and at which the through hole has a predetermined width; and a second portion that is located between the first portion and the second surface and at which the through hole has a width smaller than the predetermined width, the electrode is provided in the through hole in the first portion, and the facing portion is provided in the second portion in a manner of extending from a position closer to the center in the width direction than is the electrode toward the first surface.

11. The device according to claim 10, wherein the substrate further includes a third portion that is located between the second portion and the second surface and at which the through hole has a width larger than the width of the through hole in the second portion.

12. The device according to claim 10, wherein the substrate includes an insulating layer provided between the first portion and the electrode.

13. The device according to claim 12, wherein the insulating layer extends between the second portion and the electrode and between the facing portion and the electrode.

14. The device according to claim 10, wherein in the second portion, the width of the through hole increases from the first portion toward the second surface.

* * * * *